(12) United States Patent
Yamazaki et al.

(10) Patent No.: US 11,177,176 B2
(45) Date of Patent: Nov. 16, 2021

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Shunpei Yamazaki, Setagaya (JP); Toshihiko Takeuchi, Atsugi (JP); Hiromi Sawai, Atsugi (JP); Ryota Hodo, Atsugi (JP); Katsuaki Tochibayashi, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/649,890

(22) PCT Filed: Oct. 9, 2018

(86) PCT No.: PCT/IB2018/057794
§ 371 (c)(1),
(2) Date: Mar. 23, 2020

(87) PCT Pub. No.: WO2019/077438
PCT Pub. Date: Apr. 25, 2019

(65) Prior Publication Data
US 2020/0266107 A1    Aug. 20, 2020

(30) Foreign Application Priority Data

Oct. 20, 2017    (JP) .............................. JP2017-203874
Dec. 13, 2017    (JP) .............................. JP2017-238211
Feb. 27, 2018    (JP) .............................. JP2018-032994

(51) Int. Cl.
*H01L 21/8234*    (2006.01)
*H01L 29/786*    (2006.01)

(52) U.S. Cl.
CPC ...... *H01L 21/8234* (2013.01); *H01L 29/7869* (2013.01); *H01L 29/78696* (2013.01)

(58) Field of Classification Search
CPC ............. H01L 21/8234; H01L 29/7869; H01L 29/78696
(Continued)

(56) References Cited

U.S. PATENT DOCUMENTS 8,547,771 B2    10/2013    Koyama
9,287,407 B2    3/2016    Koezuka et al.
(Continued)

FOREIGN PATENT DOCUMENTS

CN    105849875 A    8/2016
CN    107980178 A    5/2018
(Continued)

OTHER PUBLICATIONS

International Search Report (Application No. PCT/IB2018/057794) dated Jan. 15, 2019.
(Continued)

*Primary Examiner* — Tong-Ho Kim
(74) *Attorney, Agent, or Firm* — Robinson Intellectual Property Law Office; Eric J. Robinson

(57) ABSTRACT

A semiconductor device that can have favorable electrical characteristics and can be highly integrated is provided. The semiconductor device includes a first insulator; a second insulator over the first insulator; an oxide over the second insulator; a first conductor and a second conductor over the oxide; a third insulator over the oxide; a third conductor positioned over the third insulator and overlapping with the oxide; a fourth insulator in contact with the second insulator, a side surface of the oxide, a side surface of the first conductor, a top surface of the first conductor, a side surface of the second conductor, a top surface of the second con-
(Continued)

ductor, and a side surface of the third insulator; and a fifth insulator in contact with a top surface of the third insulator and a top surface of the third conductor, and a top surface of the fourth insulator is in contact with the fifth insulator.

5 Claims, 18 Drawing Sheets

(58) Field of Classification Search
USPC .......................................................... 257/213
See application file for complete search history.

(56) References Cited

U.S. PATENT DOCUMENTS

| | | | |
|---|---|---|---|
| 9,530,856 | B2 | 12/2016 | Miyai |
| 9,773,919 | B2 | 9/2017 | Sasagawa et al. |
| 9,825,177 | B2 | 11/2017 | Yamazaki et al. |
| 9,859,437 | B2 | 1/2018 | Morosawa et al. |
| 9,865,712 | B2 | 1/2018 | Okamoto et al. |
| 9,935,203 | B2 | 4/2018 | Sasagawa et al. |
| 9,966,473 | B2 | 5/2018 | Endo |
| 10,181,531 | B2 | 1/2019 | Sasagawa et al. |
| 10,367,096 | B2 | 7/2019 | Yamazaki et al. |
| 10,424,676 | B2 | 9/2019 | Sasagawa et al. |
| 10,446,671 | B2 | 10/2019 | Okamoto et al. |
| 10,546,958 | B2 | 1/2020 | Endo |
| 2015/0187898 | A1 | 7/2015 | Miyai |
| 2016/0260822 | A1 | 9/2016 | Okamoto et al. |
| 2016/0336454 | A1* | 11/2016 | Endo .................. H01L 21/8258 |
| 2017/0012139 | A1* | 1/2017 | Sasagawa ......... H01L 21/32136 |
| 2017/0033226 | A1 | 2/2017 | Yamazaki et al. |
| 2017/0062619 | A1 | 3/2017 | Sasagawa et al. |
| 2018/0076330 | A1 | 3/2018 | Morosawa et al. |
| 2019/0378918 | A1 | 12/2019 | Okamoto et al. |

FOREIGN PATENT DOCUMENTS

| | | |
|---|---|---|
| JP | 2011-228622 A | 11/2011 |
| JP | 2012-257187 A | 12/2012 |
| JP | 2013-016782 A | 1/2013 |
| JP | 2015-144251 A | 8/2015 |
| JP | 2016-167584 A | 9/2016 |
| JP | 2016-213468 A | 12/2016 |
| JP | 2017-034246 A | 2/2017 |
| JP | 2017-045989 A | 3/2017 |
| JP | 2017-050530 A | 3/2017 |
| KR | 2016-0102196 A | 8/2016 |
| KR | 2018-0025942 A | 3/2018 |
| KR | 2018-0042280 A | 4/2018 |
| TW | 201533903 | 9/2015 |
| TW | 201642472 | 12/2016 |
| TW | 201 707215 | 2/2017 |
| TW | 201709348 | 3/2017 |
| TW | 201724515 | 7/2017 |
| WO | WO-2015/097633 | 7/2015 |
| WO | WO-2016/139548 | 9/2016 |
| WO | WO-2017/006207 | 1/2017 |
| WO | WO-2017/033102 | 3/2017 |

OTHER PUBLICATIONS

Written Opinion (Application No. PCT/IB2018/057794) dated Jan. 15, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium.Gallium.Zinc Oxide", Jpn. J. Appl. Phys. (Japanese Journal of Applied Physics) , 2012, vol. 51, p. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

* cited by examiner

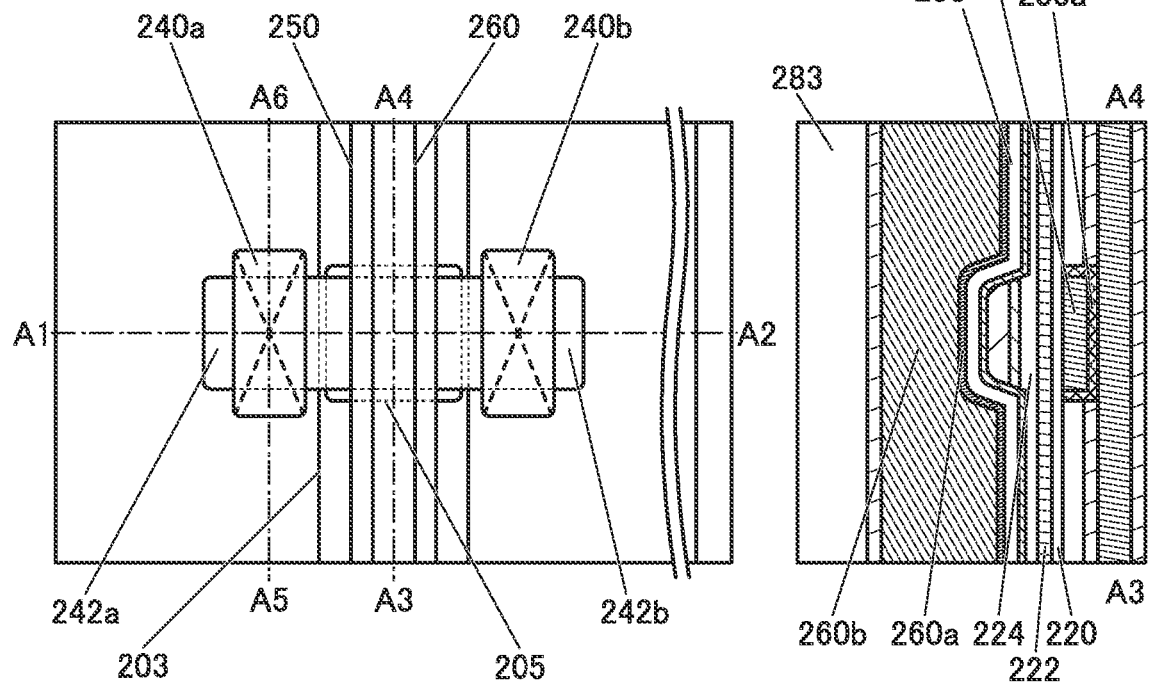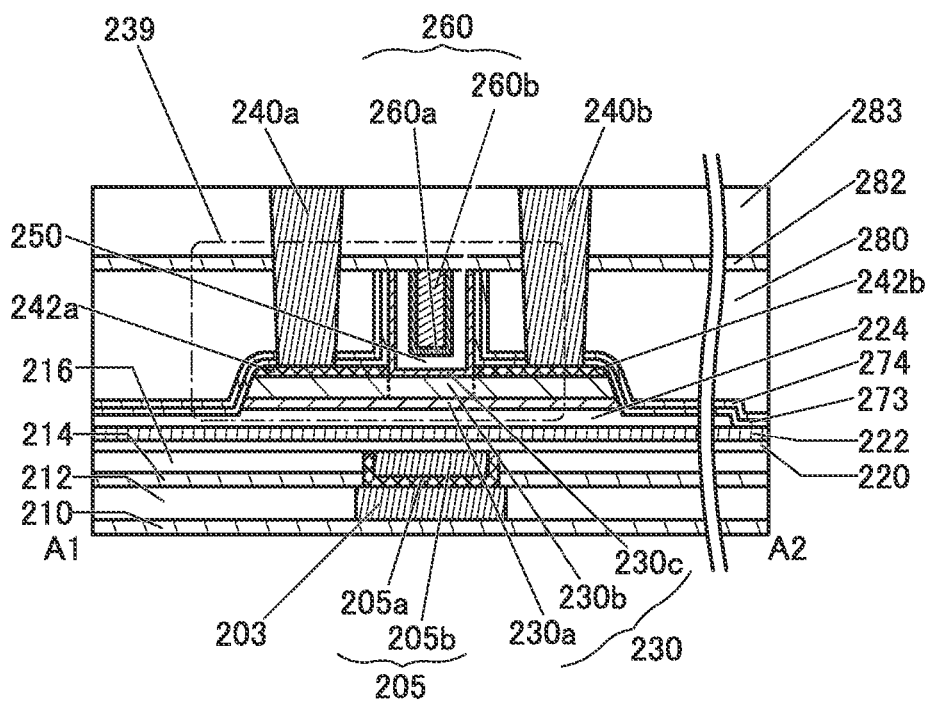

SEMICONDUCTOR DEVICE AND METHOD FOR MANUFACTURING SEMICONDUCTOR DEVICE

TECHNICAL FIELD

One embodiment of the present invention relates to a semiconductor device and a method for manufacturing the semiconductor device. Another embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition (composition of matter).

BACKGROUND ART

A silicon-based semiconductor material is widely known as a semiconductor thin film that can be used in a transistor, and as another material, an oxide semiconductor has attracted attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). In Non-Patent Document 1 and Non-Patent Document 2, a technique for fabricating a transistor using an oxide semiconductor having a CAAC structure is also disclosed. Moreover, Non-Patent Document 4 and Non-Patent Document 5 show that a fine crystal is included even in an oxide semiconductor which has lower crystallinity than an oxide semiconductor having the CAAC structure or the nc structure.

A self-aligned transistor has been proposed as the transistor using an oxide semiconductor. A method in which, for the self-aligned transistor, a metal film is formed over a source region and a drain region and heat treatment is performed on the metal film so that the resistance of the metal film is increased and the resistance of the source region and the drain region is reduced is disclosed (see Patent Document 2).

As a method for fabricating the transistor using an oxide semiconductor, a method in which a metal film is formed over a source region and a drain region, heat treatment is performed, and a dopant is introduced through the metal film so that the resistance of the source region and the drain region is reduced is disclosed (see Patent Document 3).

In addition, a transistor that uses IGZO for an active layer has an extremely low off-state current (see Non-Patent Document 6), and an LSI and a display utilizing the characteristics have been reported (see Patent Document 1, Non-Patent Document 7, and Non-Patent Document 8).

PRIOR ART DOCUMENTS

Patent Documents

[Patent Document 1] Japanese Published Patent Application No. 2012-257187
[Patent Document 2] Japanese Published Patent Application No. 2011-228622
[Patent Document 3] Japanese Published Patent Application No. 2013-016782

Non-Patent Documents

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

In Patent Document 2, when the resistance of a source region and a drain region is reduced, a metal film is formed over the source region and the drain region and heat treatment is performed on the metal film in an oxygen atmosphere. By performing the heat treatment, a constituent element of the metal film enters the source region and the drain region of an oxide semiconductor film as a dopant, whereby the resistance is reduced. By performing the heat treatment in an oxygen atmosphere, the conductive film is oxidized, whereby the resistance of the conductive film is increased. Note that since the heat treatment is performed in an oxygen atmosphere, the metal film has a weak effect of extracting oxygen from the oxide semiconductor film.

Patent Document 2 discloses the oxygen concentration in a region where a channel is formed (a channel formation region), and does not refer to the concentration of impurities such as water and hydrogen. That is, purification of the channel formation region (a reduction in impurities such as water and hydrogen, typically, dehydration or dehydrogenation) is not performed; thus, there is a problem in that a transistor tends to have normally-on characteristics. Note that normally-on characteristics of a transistor mean a state where a channel exists and a current flows through the transistor without application of a voltage to a gate. In contrast, normally-off characteristics of a transistor mean a state where a current does not flow through the transistor without application of a voltage to a gate.

In view of the above problems, an object of one embodiment of the present invention is to provide a semiconductor device having favorable electrical characteristics by stably reducing the resistance of a source region and a drain region of a transistor and purifying a channel formation region.

Another object of one embodiment of the present invention is to provide a semiconductor device that can be miniaturized or highly integrated. Another object of one embodiment of the present invention is to provide a semiconductor device having favorable electrical characteristics. Another object of one embodiment of the present invention is to provide a semiconductor device with high productivity.

Another object of one embodiment of the present invention is to provide a semiconductor device that can retain data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device in which power consumption can be reduced. Another object of one embodiment of the present invention is to provide a novel semiconductor device.

Note that the descriptions of these objects do not disturb the existence of other objects. One embodiment of the present invention does not have to achieve all the objects. Other objects will be apparent from and can be derived from the description of the specification, the drawings, the claims, and the like.

Means for Solving the Problems

One embodiment of the present invention is a semiconductor device including a first insulator; a second insulator over the first insulator; an oxide over the second insulator; a first conductor and a second conductor over the oxide; a third insulator over the oxide; a third conductor positioned over the third insulator and overlapping with the oxide; a fourth insulator in contact with the second insulator, a side surface of the oxide, a side surface of the first conductor, a top surface of the first conductor, a side surface of the second conductor, a top surface of the second conductor, and a side surface of the third insulator; and a fifth insulator in contact with a top surface of the third insulator and a top surface of the third conductor, in which a top surface of the fourth insulator is in contact with the fifth insulator.

Another embodiment of the present invention is a semiconductor device including a first insulator; a second insulator over the first insulator; an oxide over the second insulator; a first conductor and a second conductor over the oxide; a third insulator over the oxide; a third conductor positioned over the third insulator and overlapping with the oxide; a fourth insulator in contact with the second insulator, a side surface of the oxide, a side surface of the first conductor, a top surface of the first conductor, a side surface of the second conductor, a top surface of the second conductor, and a side surface of the third insulator; and a fifth insulator in contact with a top surface of the third insulator and a top surface of the third conductor, in which a top surface of the fourth insulator is in contact with the fifth insulator, the second insulator has an opening exposing the first insulator, and the fourth insulator is in contact with the first insulator through the opening.

Furthermore, in the above, it is preferable that the first insulator, the fourth insulator, and the fifth insulator be less likely to transmit oxygen than the second insulator and the third insulator.

Moreover, it is preferable that the first insulator, the fourth insulator, and the fifth insulator be less likely to transmit hydrogen than the second insulator and the third insulator.

Furthermore, each of the first insulator, the fourth insulator, and the fifth insulator is preferably an oxide containing one or both of aluminum and hafnium.

Another embodiment of the present invention is a method for manufacturing a semiconductor device including: forming a first insulator over a substrate; depositing an oxide film and a first conductive film in this order over the first insulator; processing the oxide film and the first conductive film to form an oxide and a conductor layer; depositing a dummy gate film to cover the oxide and the conductor layer; processing the dummy gate film to form a dummy gate layer; depositing a first insulating film to cover the first insulator, the oxide, and the conductor layer; depositing a second insulating film over the first insulating film; partly removing the dummy gate layer, the first insulating film, and the second insulating film by first CMP treatment until part of the dummy gate layer is exposed; etching part of the conductor layer and the dummy gate layer to form a first conductor and a second conductor and expose the oxide; depositing a third insulating film and a second conductive film in this order; removing the third insulating film and the second conductive film by second CMP treatment until part of the second insulating film is exposed to form a third insulator and a third conductor; and depositing a fourth insulating film to cover the second insulating film, the third insulator, and the third conductor.

Effect of the Invention

According to one embodiment of the present invention, a semiconductor device having favorable electrical characteristics can be provided. According to one embodiment of the present invention, a semiconductor device that can be miniaturized or highly integrated can be provided.

According to one embodiment of the present invention, a semiconductor device with high productivity can be provided.

A semiconductor device that can retain data for a long time can be provided. A semiconductor device capable of high-speed data writing can be provided. A semiconductor device with high design flexibility can be provided. A semiconductor device in which power consumption can be reduced can be provided. A novel semiconductor device can be provided.

Note that the descriptions of the effects do not disturb the existence of other effects. One embodiment of the present invention does not necessarily achieve all these effects. Other effects will be apparent from and can be derived from the descriptions of the specification, the drawings, the claims, and the like.

BRIEF DESCRIPTION OF THE DRAWINGS

FIG. 1 Top and cross-sectional views of a semiconductor device of one embodiment of the present invention.

MODE FOR CARRYING OUT THE INVENTION

Figure 2:
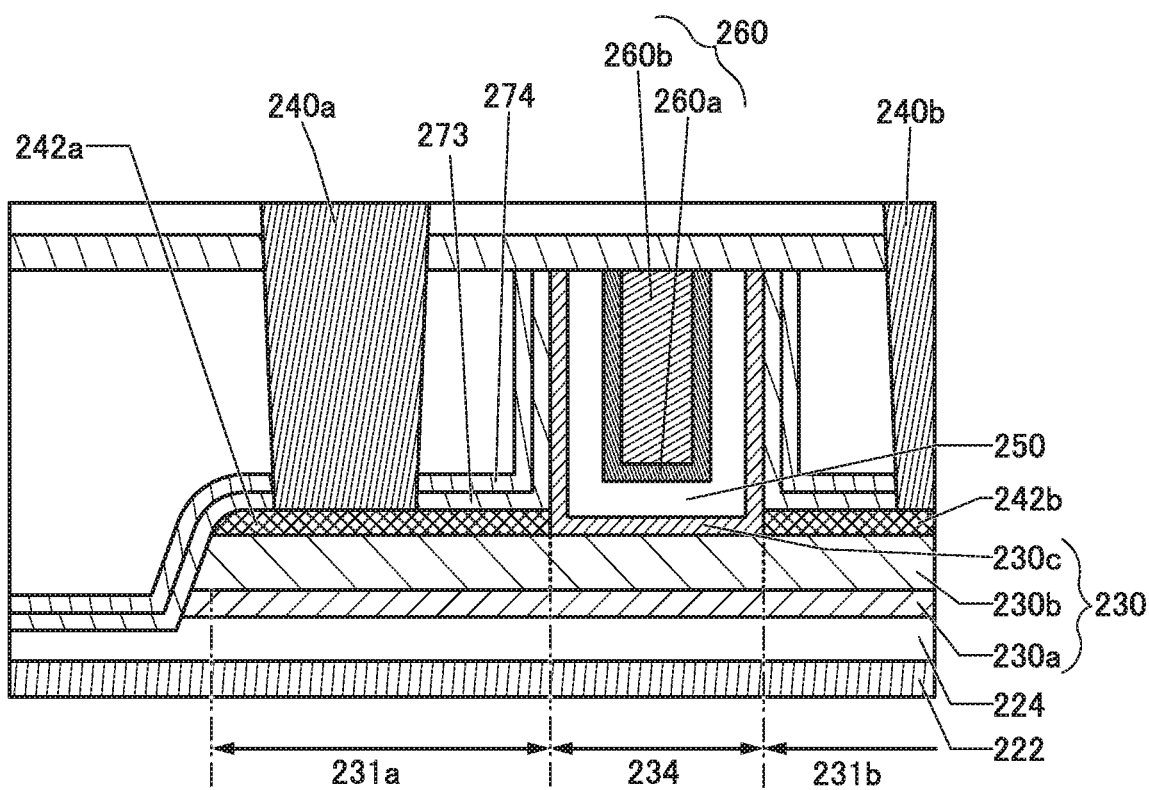
FIG. 2 A cross-sectional view of a semiconductor device of one embodiment of the present invention.

Hereinafter, embodiments will be described with reference to the drawings. Note that the embodiments can be implemented with many different modes, and it will be readily appreciated by those skilled in the art that modes and details thereof can be changed in various ways without departing from the spirit and scope thereof. Thus, the present invention should not be interpreted as being limited to the following descriptions of the embodiments.

In the drawings, the size, the layer thickness, or the region is exaggerated for clarity in some cases. Therefore, they are not necessarily limited to the illustrated scale. Note that the drawings are schematic views showing ideal examples, and shapes or values are not limited to those shown in the drawings. For example, in the actual manufacturing process, a layer, a resist mask, or the like might be unintentionally reduced in size by treatment such as etching, which might not be reflected in the drawings for easy understanding. In the drawings, the same reference numerals are used for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. Furthermore, the description of some hidden lines and the like might be omitted.

In this specification and the like, ordinal numbers such as first and second are used for convenience and do not denote the order of steps or the stacking order of layers. Therefore, for example, description can be made when "first" is replaced with "second", "third", or the like as appropriate. In addition, the ordinal numbers in this specification and the like are not necessarily the same as the ordinal numbers used to specify one embodiment of the present invention.

In this specification and the like, the terms for explaining arrangement, such as "over" and "under", are used for convenience to describe the positional relation between components with reference to drawings. Furthermore, the positional relation between components is changed as appropriate in accordance with a direction in which each component is described. Thus, without limitation to terms described in this specification, the description can be changed appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or texts, a connection relation other than one shown in drawings or texts is regarded as being described in the drawings or the texts.

Here, X and Y denote an object (e.g., a device, an element, a circuit, a wiring, an electrode, a terminal, a conductive film, or a layer).

Furthermore, functions of a source and a drain might be switched when a transistor of opposite polarity is employed or a direction of current flow is changed in circuit operation, for example. Therefore, the terms "source" and "drain" can sometimes be used interchangeably in this specification and the like.

Note that in this specification and the like, depending on transistor structures, a channel width in a region where a channel is actually formed (hereinafter, referred to as an "effective channel width") is different from a channel width shown in a top view of a transistor (hereinafter, referred to as an "apparent channel width") in some cases. For example, when a gate covers a side surface of a semiconductor, an effective channel width is greater than an apparent channel width, and its influence cannot be ignored in some cases. For example, in a miniaturized transistor having a gate covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Furthermore, in this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration of lower than 0.1 atomic % can be regarded as an impurity. When an impurity is contained, for example, DOS (Density of States) in a semiconductor may be increased or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also functions as an impurity in some cases. In addition, in the case of an oxide semiconductor, oxygen vacancies may be formed by entry of impurities, for example. Furthermore, when the semiconductor is silicon, examples of an impurity that changes the characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, "silicon nitride oxide" is a material that contains more nitrogen than oxygen in its composition.

In this specification and the like, "parallel" indicates a state where two straight lines are placed at an angle of greater than or equal to −10° and less than or equal to 10°. Accordingly, the case where the angle is greater than or equal to −5° and less than or equal to 5° is also included. Moreover, "substantially parallel" indicates a state where two straight lines are placed at an angle of greater than or equal to −30° and less than or equal to 30°. In addition, "perpendicular" indicates a state where two straight lines are placed at an angle of greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle of greater than or equal to 60° and less than or equal to 120°.

Note that in this specification, a barrier film means a film having a function of inhibiting the transmission of oxygen and impurities such as water and hydrogen, and the barrier film having conductivity is sometimes referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS FET or an OS transistor can also be referred to as a transistor including an oxide or an oxide semiconductor.

In this specification and the like, "normally off" means that a current per micrometer of channel width flowing through a transistor when a potential is not applied to a gate or a ground potential is applied to the gate is $1 \times 10^{-20}$ A or lower at room temperature, $1 \times 10^{-18}$ A or lower at 85° C., or $1 \times 10^{-16}$ A or lower at 125° C.

Embodiment 1

An example of a semiconductor device including a transistor 200 of one embodiment of the present invention will be described below.

<Structure Example of Semiconductor Device>

FIG. 1 includes a top view and cross-sectional views of the transistor 200 of one embodiment of the present invention and the periphery of the transistor 200.

FIG. 1(A) is a top view of the semiconductor device including the transistor 200. FIG. 1(B) and FIG. 1(C) are cross-sectional views of the semiconductor device. Here, FIG. 1(B) is a cross-sectional view of a portion indicated by a dashed-dotted line A1-A2 in FIG. 1(A), and is a cross-sectional view in the channel length direction of the transistor 200. FIG. 1(C) is a cross-sectional view of a portion indicated by a dashed-dotted line A3-A4 in FIG. 1(A), and is a cross-sectional view in the channel width direction of the transistor 200. Note that for clarity of the drawing, some components are not illustrated in the top view of FIG. 1(A).

The semiconductor device of one embodiment of the present invention includes the transistor 200, and an insulator 210, an insulator 212, an insulator 280, an insulator 282, and an insulator 283 functioning as interlayer films. The semiconductor device also includes a conductor 203 functioning as a wiring and a conductor 240 (a conductor 240a and a conductor 240b) functioning as a plug, which are electrically connected to the transistor 200.

Note that the conductor 203 is formed to be embedded in the insulator 212. The level of a top surface of the conductor 203 and the level of a top surface of the insulator 212 can be substantially the same. Note that although a structure in which the conductor 203 is a single layer is illustrated, the present invention is not limited thereto. For example, the conductor 203 may have a multilayer structure of two or more layers. Note that in the case where a structure body has a stacked-layer structure, the layers may be distinguished by ordinal numbers corresponding to the formation order.

The conductor 240 is formed in contact with an inner wall of an opening of an insulator 273, the insulator 274, the insulator 280, the insulator 282, and the insulator 283. Here, the level of a top surface of the conductor 240 and the level of a top surface of the insulator 283 can be substantially the same. Although a structure in which the conductor 240 of the transistor 200 is a single layer is illustrated, the present invention is not limited thereto. For example, the conductor 240 may have a stacked-layer structure of two or more layers. A conductor 260 and the insulator 280 are provided so that the levels of top surfaces thereof are substantially the same.

Furthermore, as illustrated in FIG. 1(B), an insulator 224 has an opening exposing an insulator 222 in the vicinity of an edge portion of the semiconductor device on the A2 side. The insulator 222 is in contact with the insulator 273 through the opening.

[Transistor 200]

As illustrated in FIG. 1, the transistor 200 includes an insulator 214 and an insulator 216 positioned over a substrate (not illustrated); a conductor 205 (a conductor 205a and a conductor 205b) positioned to be embedded in the insulator 214 and the insulator 216; an insulator 220 positioned over the insulator 216 and the conductor 205; the insulator 222 positioned over the insulator 220; the insulator 224 positioned over the insulator 222; an oxide 230 (an oxide 230a, an oxide 230b, and an oxide 230c) positioned over the insulator 224; an insulator 250 positioned over the oxide 230; the conductor 260 (a conductor 260a and a conductor 260b) positioned over the insulator 250; a conductor 242a and a conductor 242b in contact with part of a top surface of the oxide 230; the insulator 273 positioned in contact with part of a top surface of the insulator 224, part of a top surface of the insulator 222, a side surface of the oxide 230a, a side surface of the oxide 230b, a side surface of the conductor 242a, a top surface of the conductor 242a, a side surface of the conductor 242b, a top surface of the conductor 242b, and a side surface of the oxide 230c; and the insulator 274 positioned in contact with the insulator 273. The conductor 260 includes the conductor 260a and the conductor 260b, and the conductor 260a is positioned to cover a bottom surface and side surfaces of the conductor 260b. Here, as illustrated in FIG. 1(B), a top surface of the conductor 260 is positioned to be substantially aligned with a top surface of the insulator 273 and a top surface of the insulator 274.

Although the transistor 200 has a structure in which three layers of the oxide 230a, the oxide 230b, and the oxide 230c are stacked, the present invention is not limited thereto. For example, it is possible to employ a single layer of the oxide 230b, a two-layer structure of the oxide 230b and the oxide 230a, a two-layer structure of the oxide 230b and the oxide 230c, or a stacked-layer structure of four or more layers. Similarly, although the transistor 200 has a structure in which the conductor 260a and the conductor 260b are stacked, the present invention is not limited thereto.

In the transistor 200, a metal oxide functioning as an oxide semiconductor (hereinafter also referred to as an oxide semiconductor) is preferably used as the oxide 230 (the oxide 230a, the oxide 230b, and the oxide 230c) including a channel formation region. A transistor using an oxide semiconductor has an extremely low leakage current in a non-conduction state; thus, a semiconductor device with low power consumption can be provided. An oxide semiconductor can be deposited by a sputtering method or the like, and thus can be used for a transistor constituting a highly integrated semiconductor device.

Here, FIG. 2 illustrates an enlarged view of a region 239 surrounded by a dashed line in FIG. 1(B).

As illustrated in FIG. 2, the oxide 230 includes a region 234 functioning as a channel formation region of the transistor 200 and a region 231 (a region 231a and a region 231b) functioning as a source region and a drain region of the transistor 200.

The region 231a functioning as a source region or a drain region is in contact with the conductor 242a functioning as a source electrode or a drain electrode, and the region 231b functioning as a source region or a drain region is in contact with the conductor 242b functioning as a source electrode or a drain electrode. The region 231a and the region 231b are low-resistance regions having a low oxygen concentration and a high carrier concentration. The region 234 functioning as the channel formation region is a high-resistance region having a higher oxygen concentration and a lower carrier density than the region 231 functioning as the source region or the drain region.

The concentration of at least one of a metal element and an impurity element such as hydrogen and nitrogen in the region 231 is preferably higher than that in the region 234.

In the oxide 230, the boundaries between the regions are difficult to clearly observe in some cases. The concentration of a metal element and an impurity element such as hydrogen and nitrogen, which is detected in each region, may be not only gradually changed between the regions, but also continuously changed (also referred to as gradation) in each region. That is, the region closer to the channel formation region preferably has a lower concentration of a metal element and an impurity element such as hydrogen and nitrogen.

Here, in a transistor using an oxide semiconductor, electrical characteristics are likely to vary when impurities and oxygen vacancies exist in a channel formation region in the oxide semiconductor; as a result, the reliability is reduced, in some cases. Moreover, when the channel formation region of the oxide semiconductor includes oxygen vacancies, the transistor tends to have normally-on characteristics. Thus, it is preferable that oxygen vacancies in the channel formation region 234 be reduced as much as possible.

As the insulator 273, an oxide having a function of inhibiting the transmission of oxygen and impurities such as water and hydrogen is preferably used. For example, aluminum oxide or hafnium oxide is preferably used. The insulator 273 can be deposited by a sputtering method, a CVD method, an MBE method, a PLD method, an ALD method, or the like. An aluminum oxide film is preferably deposited as the insulator 273 by a sputtering method, for example. When an aluminum oxide film is deposited by a sputtering method using a gas containing oxygen, oxygen can be injected into the insulator 224. In other words, the insulator 224 can contain oxygen at a higher proportion than oxygen in the stoichiometric composition (also referred to as excess oxygen). Excess oxygen can be injected into the region 234 serving as the channel formation region through the insulator 224.

As the insulator 274, an oxide having a function of inhibiting the transmission of oxygen and impurities such as water and hydrogen is preferably used. For example, aluminum oxide or hafnium oxide is preferably used. The insulator 274 can be deposited by a sputtering method, a CVD method, an MBE method, a PLD method, an ALD method, or the like. An oxide is preferably deposited as the insulator 274 by an ALD method, for example. When an oxide is deposited by an ALD method, a dense thin film with good coverage and few defects can be deposited even in the case of being deposited over a step-like shape. Furthermore, the insulator 224 and the insulator 280 are more likely to transmit oxygen than the insulator 273, the insulator 274, and the insulator 282.

As illustrated in FIG. 1, the insulator 273 is positioned over the insulator 224 to cover the side surface of the oxide 230a, the side surface of the oxide 230b, the side surface of the conductor 242a, the top surface of the conductor 242a, the side surface of the conductor 242b, the top surface of the conductor 242b, and the side surface of the oxide 230c. The insulator 274 is positioned to cover the insulator 273. The insulator 282 is positioned in contact with the top surface of the insulator 273, the top surface of the insulator 274, a top surface of the insulator 250, and the top surface of the conductor 260. For the insulator 282, it is preferable to use an oxide having a function of inhibiting the transmission of oxygen and impurities such as water and hydrogen, as for the insulator 273 or the insulator 274.

That is, the transistor 200 is covered with the insulator 273, the insulator 274, and the insulator 282 that are oxides having a function of inhibiting the transmission of oxygen and impurities such as water and hydrogen. With such a structure, upward diffusion of oxygen can be inhibited. Furthermore, diffusion of oxygen into the conductor 260 can be inhibited, and thus, oxidation of the conductor 260 can be inhibited. Furthermore, entry of impurities such as water and hydrogen from the outside to the transistor 200 can be inhibited.

Accordingly, a semiconductor device including a transistor having a high on-state current can be provided. Alternatively, a semiconductor device including a transistor having a low off-state current can be provided. Alternatively, a semiconductor device that has small variation in electrical characteristics, stable electrical characteristics, and improved reliability can be provided.

The structure of the semiconductor device including the transistor 200 of one embodiment of the present invention will be described in detail below.

The conductor 203 extends in the channel width direction as illustrated in FIG. 1(A) and FIG. 1(C) and functions as a wiring that applies a potential to the conductor 205.

The conductor 205 is positioned to overlap with the oxide 230 and the conductor 260. Moreover, the conductor 205 is preferably provided over and in contact with the conductor 203.

The conductor 260 functions as a first gate (also referred to as a top gate) in some cases. The conductor 205 functions as a second gate (also referred to as a bottom gate) in some cases. In that case, the threshold voltage of the transistor 200 can be controlled by changing a potential applied to the conductor 205 not in synchronization with but independently of a potential applied to the conductor 260. In particular, the threshold voltage of the transistor 200 can be higher than 0 V and the off-state current can be reduced by applying a negative potential to the conductor 205. Thus, a drain current when a potential applied to the conductor 260 is 0 V can be lower in the case where a negative potential is applied to the conductor 205 than in the case where the negative potential is not applied to the conductor 205.

When the conductor 205 is provided over the conductor 203, the distance between the conductor 260 and the conductor 203 having functions of the first gate and the wiring can be designed as appropriate. That is, the insulator 214, the insulator 216, and the like are provided between the conductor 203 and the conductor 260, whereby a parasitic capacitance between the conductor 203 and the conductor 260 can be reduced, and the withstand voltage between the conductor 203 and the conductor 260 can be increased.

Moreover, the reduction in the parasitic capacitance between the conductor 203 and the conductor 260 can improve the switching speed of the transistor 200, so that the transistor can have high frequency characteristics. The increase in the withstand voltage between the conductor 203 and the conductor 260 can improve the reliability of the transistor 200. Therefore, the film thicknesses of the insulator 214 and the insulator 216 are preferably large. Note that the extending direction of the conductor 203 is not limited to this; for example, the conductor 203 may extend in the channel length direction of the transistor 200.

Note that as illustrated in FIG. 1(A), the conductor 205 is positioned to overlap with the oxide 230 and the conductor 260. The conductor 205 is preferably provided larger than the region 234 of the oxide 230. As illustrated in FIG. 1(C), it is particularly preferable that the conductor 205 extend to a region outside an end portion of the region 234 of the oxide 230 that intersects with the channel width direction.

With the above structure, in the case where potentials are applied to the conductor 260 and the conductor 205, an electric field generated from the conductor 260 and an electric field generated from the conductor 205 are connected, so that the channel formation region formed in the oxide 230 can be electrically surrounded.

That is, the channel formation region in the region 234 can be electrically surrounded by the electric field of the conductor 260 having a function of the first gate and the electric field of the conductor 205 having a function of the second gate. In this specification, a transistor structure in which a channel formation region is electrically surrounded by electric fields of a first gate and a second gate is referred to as a surrounded channel (S-channel) structure.

Note that in the conductor 205, the conductor 205a is formed in contact with an inner wall of an opening of the insulator 214 and the insulator 216, and the conductor 205b is formed on the inner side. Here, the top surfaces of the conductor 205a and the conductor 205b and the top surface of the insulator 216 can be substantially level with each other. Although the transistor 200 having a structure in which the conductor 205a and the conductor 205b are stacked is illustrated, the present invention is not limited thereto. For example, the conductor 205 may have a single-layer structure or a stacked-layer structure of three or more layers.

For the conductor 205a or the first conductor of the conductor 203, it is preferable to use a conductive material, which has a function of inhibiting diffusion of impurities such as a hydrogen atom, a hydrogen molecule, a water molecule, a nitrogen atom, a nitrogen molecule, a nitrogen oxide molecule (e.g., $N_2O$, $NO$, and $NO_2$), and a copper atom, (through which the above impurities are less likely to be transmitted). Alternatively, it is preferable to use a conductive material, which has a function of inhibiting diffusion of oxygen (e.g., at least one of oxygen atoms, oxygen molecules, and the like), (through which the above oxygen is not easily transmitted). Note that in this specification, a function of inhibiting diffusion of impurities or oxygen means a function of inhibiting diffusion of any one or all of the above impurities and the above oxygen.

When the conductor 205a or the first conductor of the conductor 203 has a function of inhibiting diffusion of oxygen, the conductivity of the conductor 205b or a second conductor of the conductor 203 can be inhibited from being lowered because of oxidization. As a conductive material having a function of inhibiting diffusion of oxygen, for example, tantalum, tantalum nitride, ruthenium, or ruthenium oxide is preferably used. Thus, a single layer or a stacked layer of the above conductive materials may be used for the conductor 205a or the first conductor of the conductor 203. Thus, impurities such as water and hydrogen can be inhibited from being diffused into the transistor 200 side through the conductor 203 and the conductor 205.

Moreover, a conductive material containing tungsten, copper, or aluminum as its main component is preferably used for the conductor 205b. Note that the conductor 205b is illustrated as a single layer but may have a stacked-layer structure, for example, a stacked layer of any of the above conductive materials and titanium or titanium nitride.

The second conductor of the conductor 203 functions as a wiring, and thus, a conductor having high conductivity is preferably used. For example, a conductive material containing copper or aluminum as its main component can be used. The second conductor of the conductor 203 may have a stacked-layer structure; for example, a stacked layer of any of the above conductive materials and titanium or titanium nitride may be employed.

It is particularly preferable to use copper for the second conductor of the conductor 203. Copper is preferably used for a wiring and the like because of its small resistance. However, copper is easily diffused, and thus may deteriorate the electrical characteristics of the transistor 200 when diffused into the oxide 230. In view of the above, for example, a material through which copper is less likely to be transmitted, such as aluminum oxide or hafnium oxide, is used for the insulator 214, whereby diffusion of copper can be inhibited.

The conductor 205, the insulator 214, and the insulator 216 are not necessarily provided. In that case, part of the conductor 203 can function as the second gate.

The insulator 210 and the insulator 214 preferably function as a barrier insulating film that inhibits impurities such as water and hydrogen from entering the transistor 200 from the substrate side. Accordingly, for the insulator 210 and the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (through which the above impurities are less likely to be transmitted). Alternatively, it is preferable to use an insulating material having a function of inhibiting diffusion of oxygen (e.g., at least one of oxygen atoms, oxygen molecules, and the like) (through which the above oxygen is less likely to be transmitted).

For example, it is preferable that aluminum oxide or the like be used for the insulator 210 and that silicon nitride or the like be used for the insulator 214. Accordingly, impurities such as water and hydrogen can be inhibited from being diffused to the transistor 200 side from the substrate side through the insulator 210 and the insulator 214. Alternatively, oxygen contained in the insulator 224 or the like can be inhibited from being diffused to the substrate side through the insulator 210 and the insulator 214.

Furthermore, with the structure in which the conductor 205 is stacked over the conductor 203, the insulator 214 can be provided between the conductor 203 and the conductor 205. Here, even when a metal that is easily diffused, such as copper, is used for the conductor 203, silicon nitride or the like provided as the insulator 214 can inhibit diffusion of the metal to a layer above the insulator 214.

The dielectric constant of each of the insulator 212, the insulator 216, and the insulator 280 functioning as interlayer films is preferably lower than that of the insulator 210 or the insulator 214. When a material with a low dielectric constant is used for an interlayer film, the parasitic capacitance generated between wirings can be reduced For example, a single layer or a stacked layer of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used as the insulator 212, the insulator 216, and the insulator 280. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulators.

The insulator 220, the insulator 222, and the insulator 224 each have a function of a gate insulator.

Here, for the insulator 224 in contact with the oxide 230, an oxide insulator that contains more oxygen than that in the stoichiometric composition is preferably used. That is, an excess-oxygen region is preferably formed in the insulator 224. When such an insulator containing excess oxygen is provided in contact with the oxide 230, oxygen vacancies in the oxide 230 can be reduced and the reliability of the transistor 200 can be improved.

As the insulator including an excess-oxygen region, specifically, an oxide material that releases part of oxygen by heating is preferably used. An oxide that releases oxygen by heating is an oxide film in which the amount of released oxygen converted into oxygen molecules is greater than or equal to $1.0 \times 10^{18}$ molecules/$cm^3$, preferably greater than or equal to $1.0 \times 10^{19}$ molecules/$cm^3$, further preferably greater than or equal to $2.0 \times 10^{19}$ molecules/$cm^3$ or greater than or equal to $3.0 \times 10^{20}$ molecules/$cm^3$ in thermal desorption spectroscopy analysis (TDS analysis). Note that the temperature range of the film surface in the TDS analysis is preferably higher than or equal to 100° C. and lower than or equal to 700° C., or higher than or equal to 100° C. and lower than or equal to 400° C.

Furthermore, in the case where the insulator 224 includes an excess-oxygen region, the insulator 222 preferably has a function of inhibiting diffusion of oxygen (e.g., at least one of oxygen atoms, oxygen molecules, and the like), (the above oxygen is less likely to be transmitted).

When the insulator 222 has a function of inhibiting diffusion of oxygen, oxygen in the excess-oxygen region included in the insulator 224 is not diffused to the insulator 220 side and thus can be supplied to the oxide 230 efficiently. Furthermore, the conductor 205 can be inhibited from reacting with oxygen from the excess-oxygen region included in the insulator 224.

For example, a single layer or a stacked layer of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) is preferably used for the insulator 222. With miniaturization and high integration of a transistor, a problem such as leakage current may arise because of a thinner gate insulator. When a high-k material is used for an insulator functioning as a gate insulator, a gate potential during operation of the transistor can be reduced while the physical thickness of the gate insulator is kept.

It is particularly preferable to use an insulator containing an oxide of one or both of aluminum and hafnium, which is an insulating material having a function of inhibiting diffusion of impurities, oxygen, and the like (or an insulating material through which the above oxygen is less likely to be transmitted). As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulators.

It is preferable that the insulator 220 be thermally stable. For example, silicon oxide and silicon oxynitride, which have thermal stability, are suitable. Furthermore, when an insulator which is a high-k material is combined with silicon oxide or silicon oxynitride, the insulator 220 having a stacked-layer structure that has thermal stability and a high dielectric constant can be obtained.

Note that the insulator 220, the insulator 222, and the insulator 224 may each have a stacked-layer structure of two or more layers. In that case, without limitation to a stacked-layer structure formed of the same material, a stacked-layer structure formed of different materials may be employed.

The oxide 230 including a region functioning as a channel formation region includes the oxide 230a, the oxide 230b over the oxide 230a, and the oxide 230c over the oxide 230b. When the oxide 230a is provided below the oxide 230b, impurities can be prevented from being diffused into the oxide 230b from the components formed below the oxide 230a. When the oxide 230c is provided over the oxide 230b, impurities can be prevented from being diffused into the oxide 230b from the components formed above the oxide 230c.

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

The energy level of the conduction band minimum gradually changes at a junction portion of the oxide 230a, the oxide 230b, and the oxide 230c. In other words, the energy level of the conduction band minimum at a junction portion of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, when the oxide 230a and the oxide 230b, or the oxide 230b and the oxide 230c contain the same element (as a main component) in addition to oxygen, a mixed layer with a low density of defect states can be formed. For example, in the case where the oxide 230b is an In—Ga—Zn oxide, an In—Ga—Zn oxide, a Ga—Zn oxide, gallium oxide, or the like is preferably used for the oxide 230a and the oxide 230c.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have a high on-state current.

The oxide 230 includes the region 231 and the region 234. When the transistor 200 is turned on, the region 231a or the region 231b functions as the source region or the drain region. At least part of the region 234 functions as the region where a channel is formed.

In the transistor 200, a region with a higher resistance than the region 231 is not formed between the region 231 functioning as the source region and the drain region and the region 234 where a channel is formed, so that the on-state current and the mobility of the transistor can be increased.

Since the source region and the drain region do not overlap with the first gate (the conductor 260), formation of unnecessary capacitance between them can be inhibited.

A metal oxide functioning as an oxide semiconductor (hereinafter also referred to as an oxide semiconductor) is preferably used as the oxide 230. For example, as the metal oxide to be the region 234, it is preferable to use one having a band gap of 2 eV or more, preferably 2.5 eV or more. With the use of a metal oxide having such a wide band gap, the off-state current of the transistor can be reduced.

A transistor using an oxide semiconductor has an extremely low leakage current in a non-conduction state; thus, a semiconductor device with low power consumption can be provided. An oxide semiconductor can be deposited by a sputtering method or the like, and thus can be used for a transistor constituting a highly integrated semiconductor device.

As for the conductor 242 (the conductor 242a and the conductor 242b), one functions as a source electrode, and the other functions as a drain electrode.

A metal such as aluminum, titanium, chromium, nickel, copper, yttrium, zirconium, molybdenum, silver, tantalum, or tungsten or an alloy containing any of the metals as its main component can be used for the conductor 242. In particular, a metal nitride film of tantalum nitride or the like, ruthenium, ruthenium oxide, and the like are preferable because they have a barrier property against hydrogen or oxygen and high oxidation resistance.

Although a single layer structure is illustrated in the drawing, a stacked-layer structure of two or more layers may be employed. For example, a tantalum nitride film and a tungsten film may be stacked. Alternatively, a titanium film and an aluminum film may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used. A metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and its oxidation resistance is high.

The insulator 250 functions as a gate insulator. The insulator 250 is preferably positioned in contact with the oxide 230c. The insulator 250 is preferably formed using an insulator from which oxygen is released by heating. The insulator 250 is, for example, an oxide film in which the amount of released oxygen converted into oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/ cm$^3$ or greater than or equal to 3.0×10$^{20}$ molecules/cm$^3$ in TDS analysis. Note that the temperature range of the film surface in the TDS analysis is preferably higher than or equal to 100° C. and lower than or equal to 700° C.

Specifically, silicon oxide including excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

An insulator from which oxygen is released by heating is provided as the insulator 250 in contact with the oxide 230c, whereby oxygen can be efficiently supplied to the region 234 of the oxide 230b from the insulator 250. Furthermore, as in the insulator 224, the concentration of impurities such as water and hydrogen in the insulator 250 is preferably reduced.

Alternatively, for example, the insulator 250 may have a stacked-layer structure of a film from which oxygen is released by heating and a film having a barrier property. By provision of the film having a barrier property between the conductor 260 and the film from which oxygen is released by heating, oxygen released by heating can be inhibited from being absorbed into the conductor 260. As the film having a barrier property, a metal oxide containing aluminum, hafnium, or the like is preferably used. The metal oxide has a high dielectric constant, and thus, the equivalent oxide thickness (EOT) of the gate insulator can be reduced while the physical thickness of the gate insulator is kept.

The conductor 260 functioning as the first gate includes the conductor 260a and the conductor 260b over the conductor 260a. For the conductor 260a, like the conductor 205a, it is preferable to use a conductive material having a function of inhibiting diffusion of impurities such as a hydrogen atom, a hydrogen molecule, a water molecule, a nitrogen atom, a nitrogen molecule, a nitrogen oxide molecule (N$_2$O, NO, NO$_2$, or the like), and a copper atom. Alternatively, it is preferable to use a conductive material having a function of inhibiting diffusion of oxygen (e.g., at least one of oxygen atoms, oxygen molecules, and the like).

The conductor 260a having a function of inhibiting diffusion of oxygen suppresses diffusion of excess oxygen from the oxide 230 and the insulator 250 to the conductor 260b. Accordingly, oxidation of the conductor 260b due to excess oxygen included in the insulator 250 can be inhibited, so that a reduction in the conductivity can be prevented. Moreover, a reduction in the amount of excess oxygen supplied to the oxide 230 can be inhibited.

As a conductive material having a function of inhibiting diffusion of oxygen, for example, tantalum, tantalum nitride, ruthenium, or ruthenium oxide is preferably used. As the conductor 260a, an oxide semiconductor that can be used as the oxide 230 can be used. In that case, when the conductor 260b is deposited by a sputtering method, the conductor 260a can have a reduced electric resistance to be a conductor. This can be referred to as an OC (Oxide Conductor) electrode.

A conductive material containing tungsten, copper, or aluminum as its main component is preferably used for the conductor 260b. The conductor 260 functions as a wiring, and thus a conductor having high conductivity is preferably used. For example, a conductive material containing tungsten, copper, or aluminum as its main component can be used. The conductor 260b may have a stacked-layer structure, for example, a stacked layer of any of the above conductive materials and titanium or titanium nitride.

As in the insulator 224 or the like, the concentration of impurities such as water and hydrogen in the film of the insulator 280 is preferably reduced. The insulator 280 preferably contains excess oxygen as described above. Note that the insulator 282 may be provided over the insulator 280. The insulator 282 similar to the insulator 210 may be provided as the insulator 282. When the insulator 282 is deposited by a sputtering method, impurities in the insulator 280 can be reduced. Furthermore, the insulator 283 may be provided over the insulator 282. For the insulator 283, a material similar to that for the insulator 280 can be used.

The conductor 240a and the conductor 240b are positioned in the openings formed in the insulator 283, the insulator 282, the insulator 280, the insulator 273, and the insulator 274. The conductor 240a and the conductor 240b are provided to face each other with the conductor 260 sandwiched therebetween. Note that the top surfaces of the conductor 240a and the conductor 240b may be provided on the same surface as the top surface of the insulator 283.

The conductor 240a is in contact with the conductor 242a functioning as one of the source electrode and the drain electrode of the transistor 200, and the conductor 240b is in contact with the conductor 242b functioning as the other of the source electrode and the drain electrode of the transistor 200.

FIG. 3 includes cross-sectional views of a portion indicated by a dashed-dotted line A5-A6 in FIG. 1(A) and is a cross-sectional view of a region in the channel width direction of the transistor 200, where the conductor 240a is in contact with the conductor 242a and the oxide 230.

Figure 3A:
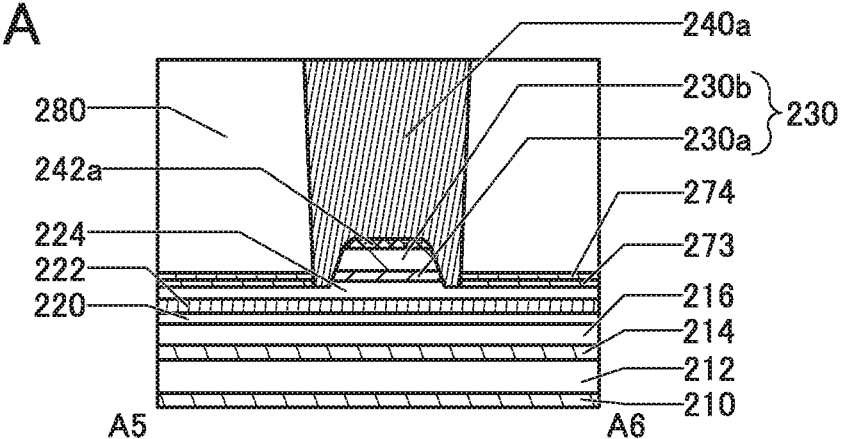
FIG. 3 Cross-sectional views of a semiconductor device of one embodiment of the present invention.
Figure 3B:
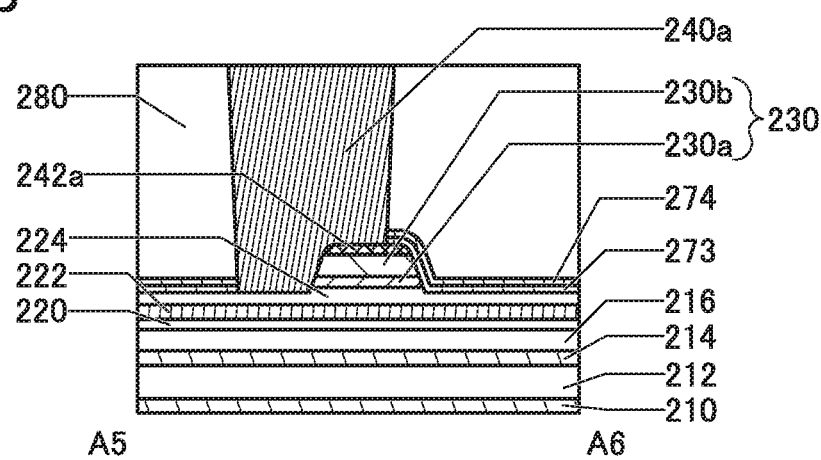
Figure 3C:
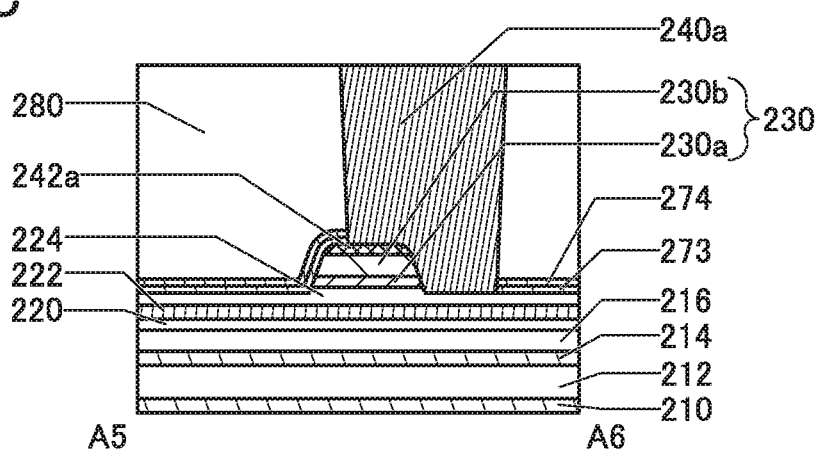

It is preferable that the conductor 240a be in contact with at least the top surface of the conductor 242a and the side surface of the conductor 242a, and it is further preferable that the conductor 240a be in contact with the side surface of the oxide 230. It is particularly preferable that the conductor 240a be in contact with one or both of the side surface of the oxide 230 on the A5 side and the side surface of the oxide 230 on the A6 side, which intersect with the channel width direction of the oxide 230. FIG. 3(A) illustrates an example in which the conductor 240a is in contact with both of the side surface on the A5 side and the side surface on the A6 side, and the region where the conductor 240a is in contact with the conductor 242a and the oxide 230 has a cross-sectional shape like a saddle (such a structure can be referred to as a saddle-surface contact). The region where the conductor 240a is in contact with the conductor 242a and the oxide 230 is not limited to the example of FIG. 3(A); for example, as illustrated in FIG. 3(B), a region where the conductor 240a is in contact with the top surface of the conductor 242a, one side surface of the conductor 242a, and one side surface of the oxide 230 may be included. As illustrated in FIG. 3(C), a region in contact with the top surface of the conductor 242a, the other side surface of the conductor 242a, and the other side surface of the oxide 230 may be included. With such a structure, the area of the region where the conductor 240a is in contact with the conductor 242a and the oxide 230 can be increased and the contact resistance between the conductor 240a and the conductor 242a and between the conductor 240a and the oxide 230 can be reduced, which is preferable. Note that a region where the conductor 240b is in contact with the conductor 242b and the oxide 230 has a structure similar to the above.

In the above manner, miniaturization of the source electrode and the drain electrode of the transistor can be achieved and, in addition, the on-state current can be increased. The conductor 240a and the conductor 240b preferably contain a metal element such as aluminum, ruthenium, titanium, tantalum, tungsten, or copper, for example.

The conductor 240a and the conductor 240b may have a stacked-layer structure. In the case where the conductor 240 has a stacked-layer structure, a conductive material having a function of inhibiting the transmission of impurities such as water and hydrogen is preferably used for a conductor in contact with the insulator 283, the insulator 282, the insulator 280, the insulator 273, and the insulator 274, like that for the conductor 205a or the like. For example, tantalum, tantalum nitride, titanium, titanium nitride, ruthenium, ruthenium oxide, or the like is preferably used. The conductive material having a function of inhibiting the transmission of impurities such as water and hydrogen may be used as a single layer or stacked layers. With the use of the conductive material, impurities such as water and hydrogen can be inhibited from entering the oxide 230 through the conductor 240a and the conductor 240b from a layer above the insulator 283.

Although not illustrated, a conductor functioning as a wiring may be positioned in contact with the top surface of the conductor 240a and the top surface of the conductor 240b. For the conductor functioning as a wiring, a conductive material containing tungsten, copper, or aluminum as its main component is preferably used. The conductor may have a stacked-layer structure, for example, a stacked layer of any of the above conductive materials and titanium or titanium nitride. Note that like the conductor 203 or the like, the conductor may be formed to be embedded in an opening provided in an insulator.

Furthermore, as illustrated in FIG. 1(B), the insulator 224 may have the opening exposing the insulator 222 in the vicinity of the edge portion of the semiconductor device on the A2 side. The insulator 222 is in contact with the insulator 273 through the opening. For the insulator 222, it is preferable to use an oxide having a function of inhibiting the transmission of oxygen and impurities such as water and hydrogen, as for the insulator 273 or the insulator 274. For example, aluminum oxide or hafnium oxide is preferably used. With such a structure of the semiconductor device including the transistor 200, impurities such as water and hydrogen can be prevented from entering the semiconductor device by the insulator 273, the insulator 274, and the insulator 222.

<Constituent Material of Semiconductor Device>

A substrate and a metal oxide that can be used for the semiconductor device will be described below.

<Substrate>

As a substrate over which the transistor 200 is formed, an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. In addition, a semiconductor substrate in which an insulator region is included in the above semiconductor substrate, e.g., an SOI (Silicon On Insulator) substrate and the like are given. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, any of these substrates provided with an element may be used. Examples of the element provided for the substrate include a capacitor, a resistor, a switching element, a light-emitting element, and a memory element.

Alternatively, a flexible substrate may be used as the substrate. Note that as a method for providing a transistor over a flexible substrate, there is a method in which a transistor is fabricated over a non-flexible substrate and then the transistor is separated from the non-flexible substrate and transferred to a substrate that is a flexible substrate. In that case, a separation layer is preferably provided between the non-flexible substrate and the transistor. In addition, the substrate may have elasticity. Furthermore, the substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to a semiconductor device over the substrate, which is caused by dropping or the like, can be reduced. That is, a durable semiconductor device can be provided.

For the substrate that is a flexible substrate, for example, a metal, an alloy, a resin, glass, or fiber thereof can be used. Note that as the substrate, a sheet, a film, a foil, or the like that contains a fiber may be used. The substrate that is a flexible substrate preferably has a lower coefficient of linear expansion because deformation due to an environment is inhibited. For the substrate that is a flexible substrate, for example, a material whose coefficient of linear expansion is lower than or equal to $1\times10^{-3}$/K, lower than or equal to $5\times10^{-5}$/K, or lower than or equal to $1\times10^{-5}$/K may be used. Examples of the resin include polyester, polyolefin, polyamide (nylon, aramid, and the like), polyimide, polycarbonate, and acrylic. In particular, aramid is suitable for the substrate that is a flexible substrate because of its low coefficient of linear expansion.

<Metal Oxide>

As the oxide 230, a metal oxide functioning as an oxide semiconductor (hereinafter also referred to as an oxide semiconductor) is preferably used. A metal oxide that can be used for the oxide 230 of the present invention will be described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be used in combination as the element M in some cases.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide having small amounts of impurities and defects (e.g., oxygen vacancies (Vo)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In some cases, IGZO has a stable structure when formed of smaller crystals (e.g., the above-described nanocrystals) rather than larger crystals (here, crystals with a size of several millimeters or several centimeters) because crystal growth tends to hardly occur particularly in the air.

An a-like OS is a metal oxide having a structure between those of the nc-OS and an amorphous oxide semiconductor. The a-like OS contains a void or a low-density region. That is, the a-like OS has low crystallinity as compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

As an oxide semiconductor used for a semiconductor of the transistor, a thin film having high crystallinity is preferably used. With the use of the thin film, the stability or the reliability of the transistor can be improved. Examples of the thin film include a thin film of a single-crystal oxide semiconductor and a thin film of a polycrystalline oxide semiconductor. However, for forming the thin film of a single-crystal oxide semiconductor or the thin film of a polycrystalline oxide semiconductor over a substrate, a high-temperature process or a laser heating process is needed. Thus, the manufacturing cost is increased, and in addition, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown a change in average crystal size due to electron beam irradiation to thin films of the above CAAC-IGZO, the above nc-IGZO, and IGZO having low crystallinity. In the thin film of IGZO having low crystallinity, crystalline IGZO with a crystal size of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for a semiconductor of a transistor.

Non-Patent Document 6 shows that a transistor using an oxide semiconductor has an extremely low leakage current in a non-conduction state; specifically, the off-state current per micrometer in the channel width of the transistor is of the order of yA/μm ($10^{-24}$ A/μm). For example, a low-power-consumption CPU utilizing a characteristic of low leakage current of the transistor using an oxide semiconductor is disclosed (see Non-Patent Document 7).

Furthermore, application of a transistor using an oxide semiconductor to a display device that utilizes the characteristic of low leakage current of the transistor has been reported (see Non-Patent Document 8). In the display device, a displayed image is changed several tens of times per second. The number of times an image is changed per second is referred to as a refresh rate. The refresh rate is also referred to as driving frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate enables the power consumption of the display device to be reduced. Such a driving method is referred to as idling stop (IDS) driving.

The discovery of the CAAC structure and the nc structure has contributed to an improvement in electrical characteristics and reliability of a transistor using an oxide semiconductor having the CAAC structure or the nc structure, a reduction in manufacturing cost, and an improvement in throughput. Furthermore, applications of the transistor to a display device and an LSI utilizing the characteristics of low leakage current of the transistor have been studied.

<Method for Manufacturing Semiconductor Device>

Next, a method for manufacturing a semiconductor device including the transistor 200 of the present invention, which is illustrated in FIG. 1, will be described with reference to FIG. 4 to FIG. 9. In FIG. 4 to FIG. 9, (A) of each drawing is a top view. Moreover, (B) of each drawing is a cross-sectional view corresponding to a portion indicated by a dashed-dotted line A1-A2 in (A), and is also a cross-sectional view in the channel length direction of the transistor 200. Furthermore, (C) of each drawing is a cross-sectional view corresponding to a portion indicated by a dashed-dotted line A3-A4 in (A), and is also a cross-sectional view in the channel width direction of the transistor 200. Note that for simplification of the drawings, some components are not illustrated in the top view of (A) of each drawing.

First, a substrate (not illustrated) is prepared and the insulator 210 is deposited over the substrate. The insulator 210 can be deposited by a sputtering method, a chemical vapor deposition (CVD) method, a molecular beam epitaxy (MBE) method, a pulsed laser deposition (PLD) method, an ALD (Atomic Layer Deposition) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object. For example, a wiring, an electrode, an element (e.g., a transistor or a capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method is also a deposition method which enables less plasma damage to an object. An ALD method also does not cause plasma damage during deposition, so that a film with few defects can be obtained. Note that a precursor used in an ALD method sometimes contains impurities such as carbon. Thus, in some cases, a film provided by an ALD method contains impurities such as carbon in a larger amount than a film provided by another deposition method. Note that impurities can be quantified by X-ray photoelectron spectroscopy (XPS).

Unlike in a deposition method in which particles ejected from a target or the like are deposited, in a CVD method and an ALD method, a film is formed by reaction at a surface of an object. Thus, a CVD method and an ALD method are deposition methods that are less likely to be influenced by the shape of an object and thus have favorable step coverage. In particular, an ALD method enables excellent step coverage and excellent thickness uniformity and can be favorably used to cover a surface of an opening with a high aspect ratio, for example. On the other hand, an ALD method has a relatively low deposition rate; hence, it is sometimes preferable to combine an ALD method with another deposition method with a high deposition rate, such as a CVD method.

A CVD method and an ALD method enable control of the composition of a film to be obtained with a flow rate ratio of the source gases. For example, by a CVD method or an ALD method, a film with a certain composition can be deposited depending on the flow rate ratio of the source gases. Moreover, by a CVD method or an ALD method, by changing the flow rate ratio of the source gases during the deposition, a film whose composition is continuously changed can be deposited. In the case where the film is deposited while changing the flow rate ratio of the source gases, as compared to the case where the film is deposited using a plurality of deposition chambers, time taken for the deposition can be shortened because time taken for transfer and pressure adjustment is omitted. Thus, the productivity of semiconductor devices can be improved in some cases.

In this embodiment, for the insulator 210, aluminum oxide is deposited by a sputtering method. The insulator 210 may have a multilayer structure. For example, a structure may be employed in which aluminum oxide is deposited by a sputtering method and another aluminum oxide is deposited over the aluminum oxide by an ALD method. Alternatively, a structure may be employed in which aluminum oxide is deposited by an ALD method and another aluminum oxide is deposited over the aluminum oxide by a sputtering method.

Then, a conductive film to be the conductor 203 is deposited over the insulator 210. The conductive film to be the conductor 203 can be deposited by a sputtering method, a CVD method, an MBE method, a PLD method, an ALD method, or the like. The conductive film to be the conductor 203 can be a multilayer film. In this embodiment, tungsten is deposited as the conductive film to be the conductor 203.

Next, the conductive film to be the conductor 203 is processed by a lithography method, so that the conductor 203 is formed.

In the lithography method, first, a resist is exposed to light through a mask. Next, a region exposed to light is removed or left using a developing solution, so that a resist mask is formed. Then, etching through the resist mask is conducted, whereby a conductor, a semiconductor, an insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. Note that for removal of the resist mask, dry etching treatment such as ashing can be performed, wet etching treatment can be performed, wet etching treatment can be performed after dry etching treatment, or dry etching treatment can be performed after wet etching treatment.

A hard mask formed of an insulator or a conductor may be used instead of the resist mask. In the case where a hard mask is used, a hard mask with a desired shape can be formed by forming an insulating film or a conductive film that is the hard mask material over the conductive film to be the conductor 203, forming a resist mask thereover, and then etching the hard mask material. The etching of the conductive film to be the conductor 203 may be performed after removal of the resist mask or with the resist mask remaining. In the latter case, the resist mask may be removed during the etching. The hard mask may be removed by etching after the etching of the conductive film to be the conductor 203. The hard mask does not need to be removed in the case where the material of the hard mask does not affect the following process or can be utilized in the following process.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may employed in which different high-frequency powers are applied to one of the parallel plate electrodes. Alternatively, a structure may be employed in which a high-frequency power with the same frequency is applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

Next, an insulating film to be the insulator 212 is deposited over the insulator 210 and the conductor 203. The insulator to be the insulator 212 can be deposited by a sputtering method, a CVD method, an MBE method, a PLD method, an ALD method, or the like. In this embodiment, as the insulating film to be the insulator 212, silicon oxide is deposited by a CVD method.

Here, the thickness of the insulating film to be the insulator 212 is preferably greater than or equal to the thickness of the conductor 203. For example, when the thickness of the conductor 203 is 1, the thickness of the insulating film to be the insulator 212 is greater than or equal to 1 and less than or equal to 3. In this embodiment, the thickness of the thickness of the conductor 203 is 150 nm and the thickness of the insulating film to be the insulator 212 is 350 nm.

Next, CMP (Chemical Mechanical Polishing) treatment is performed on the insulating film to be the insulator 212, so that part of the insulating film to be the insulator 212 is removed and a surface of the conductor 203 is exposed. Thus, the conductor 203 and the insulator 212 whose top surfaces are flat can be formed (see FIG. 4).

Here, a method for forming the conductor 203 that is different from the above will be described below.

The insulator 212 is deposited over the insulator 210. The insulator 212 can be deposited by a sputtering method, a CVD method, an MBE method, a PLD method, an ALD method, or the like.

Then, an opening reaching the insulator 210 is formed in the insulator 212. Examples of the opening include a groove and a slit. A region where the opening is formed may be referred to as an opening portion. The opening may be formed by wet etching; however, dry etching is preferably used for microfabrication. As the insulator 210, it is preferable to select an insulator that functions as an etching stopper film used in forming the groove by etching the insulator 212. For example, in the case where a silicon oxide film is used as the insulator 212 in which the groove is to be formed, a silicon nitride film, an aluminum oxide film, or a hafnium oxide film is preferably used as the insulator 210.

After the formation of the opening, the conductive film to be the conductor 203 is deposited. The conductive film desirably includes a conductor that has a function of inhibiting the transmission of oxygen. For example, tantalum nitride, tungsten nitride, or titanium nitride can be used. Alternatively, a stacked-layer film of the above conductor and tantalum, tungsten, titanium, molybdenum, aluminum, copper, or a molybdenum-tungsten alloy can be used. The conductive film to be the conductor 203 can be deposited by a sputtering method, a CVD method, an MBE method, a PLD method, an ALD method, or the like.

In this embodiment, the conductive film to be the conductor 203 has a multilayer structure. First, tantalum nitride is deposited by a sputtering method, and titanium nitride is stacked over the tantalum nitride. With the use of such metal nitride for a lower layer of the conductive film to be the conductor 203, a metal that is easily diffused, such as copper, can be prevented from diffusing to the outside from the conductor 203 even when the metal is used for an upper layer of the conductive film to be the conductor 203 that is described below.

Next, a conductive film of the upper layer of the conductive film to be the conductor 203 is deposited. The conductive film can be deposited by a plating method, a sputtering method, a CVD method, an MBE method, a PLD method, an ALD method, or the like. In this embodiment, for the conductive film of the upper layer of the conductive film to be the conductor 203, a low-resistance conductive material such as copper is deposited.

Next, CMP treatment is performed to remove parts of the upper layer of the conductive film to be the conductor 203 and the lower layer of the conductive film to be the conductor 203, so that the insulator 212 is exposed. As a result, the conductive film to be the conductor 203 remains only in the opening portion. Thus, the conductor 203 whose top surface is flat can be formed. Note that the insulator 212 is partly removed by the CMP treatment in some cases. The above is the different method for forming the conductor 203.

Next, the insulator 214 is deposited over the insulator 212 and the conductor 203. The insulator 214 can be deposited by a sputtering method, a CVD method, an MBE method, a PLD method, an ALD method, or the like. In this embodiment, for the insulator 214, silicon nitride is deposited by a CVD method. As described here, an insulator through which copper is less likely to be transmitted, such as silicon nitride, is used as the insulator 214; accordingly, even when a metal that is easy to diffuse, such as copper, is used for the conductor 203, the metal can be inhibited from being diffused into layers above the insulator 214.

Next, the insulator 216 is deposited over the insulator 214. The insulator 216 can be deposited by a sputtering method, a CVD method, an MBE method, a PLD method, an ALD method, or the like. In this embodiment, for the insulator 216, silicon oxide is deposited by a CVD method.

Next, an opening reaching the conductor 203 is formed in the insulator 214 and the insulator 216. The opening may be formed by wet etching; however, dry etching is preferably used for microfabrication.

After the formation of the opening, a conductive film to be the conductor 205a is deposited. The conductive film to be the conductor 205a preferably includes a conductive material that has a function of inhibiting the transmission of oxygen. For example, tantalum nitride, tungsten nitride, or titanium nitride can be used. Alternatively, a stacked-layer film of the above conductor and tantalum, tungsten, titanium, molybdenum, aluminum, copper, or a molybdenum-tungsten alloy can be used. The conductive film to be the conductor 205a can be deposited by a sputtering method, a CVD method, an MBE method, a PLD method, an ALD method, or the like.

In this embodiment, for the conductive film to be the conductor 205a, tantalum nitride is deposited by a sputtering method.

Next, a conductive film to be the conductor 205b is deposited over the conductive film to be the conductor 205a. The conductive film can be deposited by a sputtering method, a CVD method, an MBE method, a PLD method, an ALD method, or the like.

In this embodiment, for the conductive film to be the conductor 205b, titanium nitride is deposited by a CVD method and tungsten is deposited by a CVD method over the titanium nitride.

Next, CMP treatment is performed to remove parts of the conductive film to be the conductor 205a and the conductive film to be the conductor 205b, so that the insulator 216 is exposed. As a result, the conductive film to be the conductor 205a and the conductive film to be the conductor 205b remain only in the opening portion. Thus, the conductor 205 including the conductor 205a and the conductor 205b, which has a planar top surface, can be formed (see FIG. 4). Note that the insulator 216 is partly removed by the CMP treatment in some cases.

Next, the insulator 220 is deposited over the insulator 216 and the conductor 205. The insulator 220 can be deposited by a sputtering method, a CVD method, an MBE method, a PLD method, an ALD method, or the like. In this embodiment, for the insulator 220, silicon oxide is deposited by a CVD method.

Next, the insulator 222 is deposited over the insulator 220. An insulator containing an oxide of one or both of aluminum and hafnium is preferably deposited for the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in structure bodies provided around the transistor 200 are inhibited from being diffused into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Next, an insulating film to be the insulator 224 is deposited over the insulator 222. The insulating film to be the insulator 224 can be deposited by a sputtering method, a CVD method, an MBE method, a PLD method, an ALD method, or the like.

Sequentially, heat treatment is preferably performed. The heat treatment may be performed at higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen atmosphere, an inert gas atmosphere, or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

In this embodiment, heat treatment is performed at 400° C. in a nitrogen atmosphere for one hour after the deposition of an insulating film 224A. By the heat treatment, impurities such as water and hydrogen contained in the insulating film 224A can be removed, for example.

This heat treatment can also be performed after the deposition of the insulator 220 and after the deposition of the insulator 222. Although the conditions for the above-described heat treatment can be used for the heat treatment, the heat treatment after the deposition of the insulator 220 is preferably performed in an atmosphere containing nitrogen.

Here, in order to form an excess-oxygen region in the insulating film 224A, plasma treatment containing oxygen may be performed under a reduced pressure. The plasma treatment containing oxygen is preferably performed using an apparatus including a power source for generating high-density plasma using microwaves, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulating film 224A. Alternatively, after plasma treatment containing an inert gas is performed with this apparatus, plasma treatment containing oxygen may be performed to compensate for released oxygen. Note that impurities such as water and hydrogen contained in the insulating film 224A can be removed by selecting the conditions for the plasma treatment appropriately. In that case, the heat treatment is not necessarily performed.

Figure 4A:
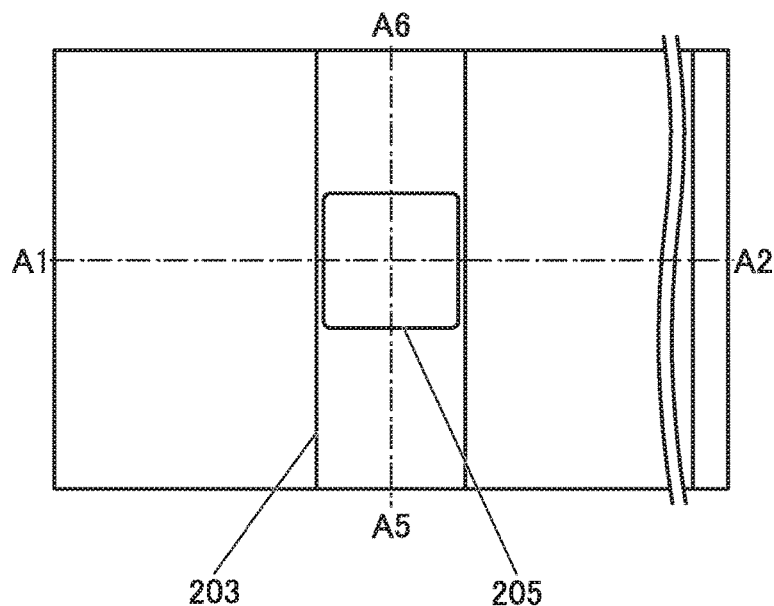
FIG. 4 A top view and cross-sectional views illustrating a method for manufacturing a semiconductor device of one embodiment of the present invention.
Figure 4C:
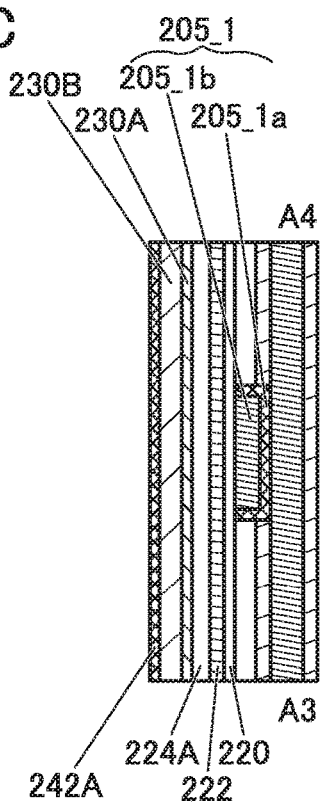
Figure 4B:
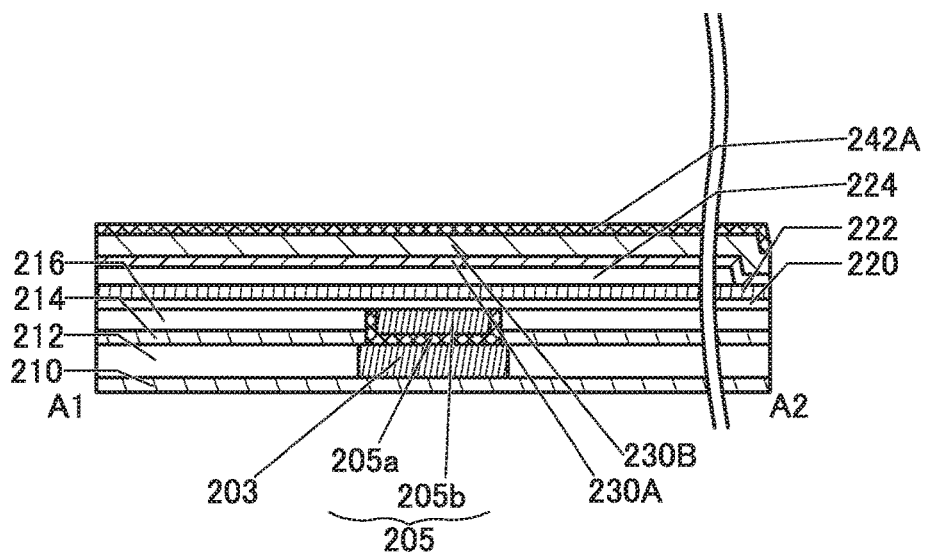
Figure 5A:
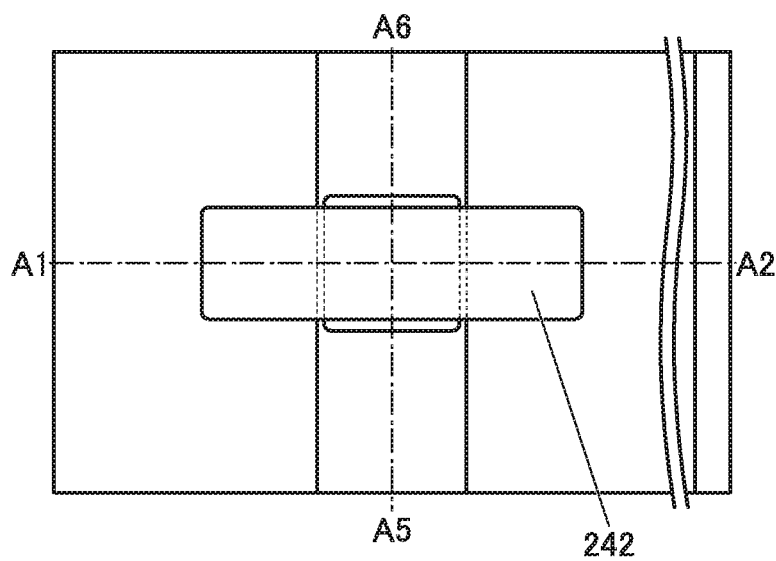
FIG. 5 A top view and cross-sectional views illustrating a method for manufacturing a semiconductor device of one embodiment of the present invention.
Figure 5C:
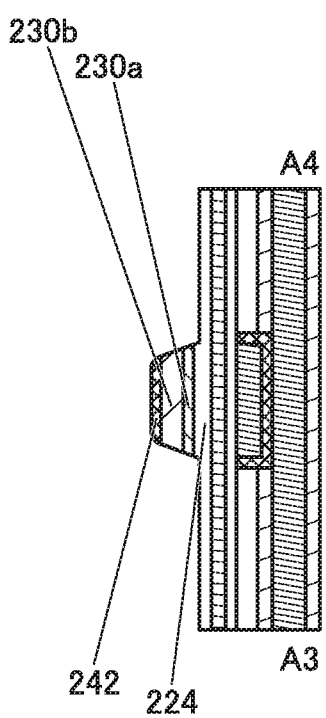
Figure 5B:
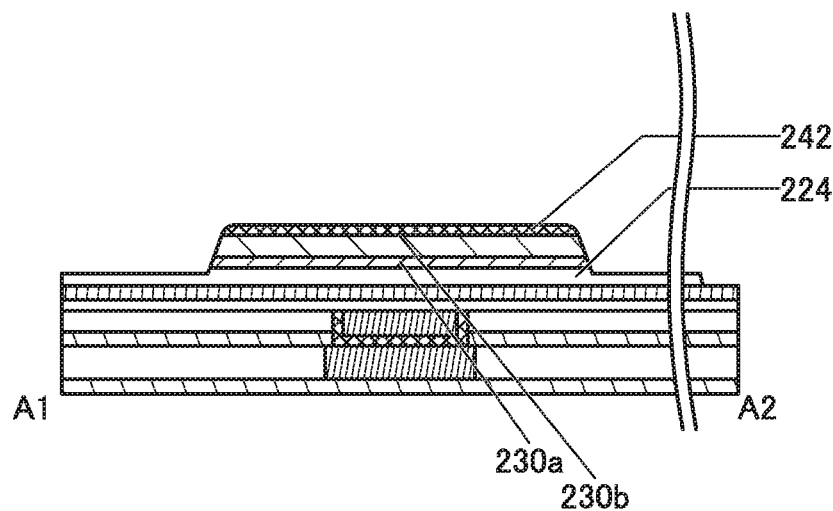

Next, the insulating film to be the insulator 224 is processed by a lithography method so that the part of the top surface of the insulator 222 is exposed, and thus the insulator 224 is formed (see FIG. 4). Note that the insulator 224 may be formed in a step later than this step, e.g., after formation of the oxide 230 or after formation of a dummy gate 262.

Next, an oxide film 230A to be the oxide 230a, an oxide film 230B to be the oxide 230b, and a conductive film 242A to be the conductor 242 are deposited in this order over the insulator 224 (see FIG. 4). Note that the oxide films are preferably deposited successively without being exposed to an air atmosphere. By the deposition without exposure to the air, impurities or moisture from the air atmosphere can be prevented from being attached to the oxide film 230A and the oxide film 230B, so that the vicinity of an interface between the oxide film 230A and the oxide film 230B can be kept clean.

The oxide film 230A, the oxide film 230B, and the conductive film 242A can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. By increasing the proportion of oxygen contained in the sputtering gas, the amount of excess oxygen in the oxide film to be deposited can be increased. In the case where the above oxide films are deposited by a sputtering method, the above In-M-Zn oxide target can be used.

In particular, when the oxide film 230A is deposited, part of oxygen contained in the sputtering gas is supplied to the insulator 224 in some cases. Therefore, the proportion of oxygen contained in the sputtering gas for the oxide film 230A is preferably 70% or higher, further preferably 80% or higher, still further preferably 100%.

In the case where the oxide film 230B is formed by a sputtering method, when the proportion of oxygen contained in the sputtering gas is 1% or higher and 30% or lower, preferably 5% or higher and 20% or lower during the deposition, an oxygen-deficient oxide semiconductor is formed. In a transistor using an oxygen-deficient oxide semiconductor for its channel formation region, relatively high field-effect mobility can be obtained.

In this embodiment, the oxide film 230A is deposited by a sputtering method using a target with In:Ga:Zn=1:1:0.5 [atomic ratio] (2:2:1 [atomic ratio]) or a target with In:Ga:Zn=1:3:4 [atomic ratio]. The oxide film 230B is deposited by a sputtering method using a target with In:Ga:Zn=4:2:4.1 [atomic ratio]. Note that each of the oxide films is preferably formed in accordance with characteristics required for the oxide 230 by appropriate selection of deposition conditions and an atomic ratio.

Next, heat treatment may be performed. For the heat treatment, the conditions for the above-described heat treatment can be used. Through the heat treatment, impurities such as water and hydrogen in the oxide film 230A and the oxide film 230B can be removed, for example. In this embodiment, treatment is performed at 400° C. in a nitrogen atmosphere for one hour, and successively another treatment is performed at 400° C. in an oxygen atmosphere for one hour.

Next, the oxide film 230A, the oxide film 230B, and the conductive film 242A are processed into island shapes to form the oxide 230a, the oxide 230b, and the conductor 242. Note that in this step, the thickness of the insulator 224 in a region not overlapping with the oxide 230a is reduced in some cases (see FIG. 5).

Here, the oxide 230a, the oxide 230b, and the conductor 242 are formed to at least partly overlap with the conductor 205. It is preferable that the side surfaces of the oxide 230a, the oxide 230b, and the conductor 242 be substantially perpendicular to the top surface of the insulator 222. When the side surfaces of the oxide 230a, the oxide 230b, and the conductor 242 are substantially perpendicular to the top surface of the insulator 222, the plurality of transistors 200 can be provided in a smaller area and at a higher density.

Alternatively, a structure may be employed in which an angle formed by the side surfaces of the oxide 230a, the oxide 230b, and the conductor 242 and the top surface of the insulator 222 is an acute angle. In that case, the angle formed by the side surfaces of the oxide 230a and the oxide 230b and the top surface of the insulator 222 is preferably greater than or equal to 60° and less than 70°. With such a shape, the coverage with the insulator 273 and the like can be improved in a later step, so that defects such as a void can be reduced.

The conductor 242 has a curved surface between its side surface and its top surface. That is, an end portion of the side surface and an end portion of the top surface are preferably curved (hereinafter, such a curved shape is also referred to as a rounded shape). The radius of curvature of the curved surface at an end portion of the conductor 242 is greater than or equal to 3 nm and less than or equal to 10 nm, preferably greater than or equal to 5 nm and less than or equal to 6 nm, for example. When the end portions are not angular, the coverage with films deposited in a later step can be improved.

Note that the oxide films may be processed by a lithography method. The processing can be performed by a dry etching method or a wet etching method. The processing by a dry etching method is suitable for microfabrication.

In some cases, the treatment such as dry etching causes the attachment or diffusion of impurities due to an etching gas or the like to a surface or an inside of the oxide 230a, the oxide 230b, or the like. Examples of the impurities include fluorine and chlorine.

In order to remove the above impurities and the like, cleaning is performed. Examples of the cleaning method include wet cleaning using a cleaning solution, plasma treatment using plasma, and cleaning by heat treatment, and any of these cleanings may be performed in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed. In this embodiment, the ultrasonic cleaning using pure water or carbonated water is performed.

Sequentially, heat treatment may be performed. For the heat treatment, the conditions for the above-described heat treatment can be used.

Next, a dummy gate film to be a dummy gate layer 262A is deposited over the insulator 224, the oxide 230a, the oxide 230b, and the conductor 242.

The dummy gate film to be the dummy gate layer 262A is processed to be used as a dummy gate. The dummy gate is an interim gate. That is, the dummy gate film to be the dummy gate layer 262A is processed to form an interim gate, the dummy gate is removed in a later step, and a gate is formed using a conductive film or the like instead. Thus, a film that is easily microfabricated and easily removed is preferably used as the dummy gate film to be the dummy gate layer 262A.

The dummy gate film to be the dummy gate layer 262A can be deposited by a sputtering method, a CVD method, an MBE method, a PLD method, an ALD method, or the like. An insulator, a semiconductor, or a conductor can be used, for example. Specifically, silicon such as polysilicon, microcrystalline silicon, or amorphous silicon, or a metal film of aluminum, titanium, tungsten, or the like is used, for example. Alternatively, a resin film may be formed by a coating method. Examples of the resin film include a photoresist, polyester, polyolefin, polyamide (nylon, aramid, or the like), polyimide, polycarbonate, and acrylic. When the resin film is formed by a coating method, a surface of the dummy gate film can be flat. In this manner, when having a flat surface, the dummy gate film can be easily processed minutely and easily removed.

The dummy gate film to be the dummy gate layer 262A can be a multilayer film using different kinds of films. For example, the dummy gate film to be the dummy gate layer 262A can have a two-layer structure in which a conductive film and a resin film over the conductive film are formed. When the dummy gate film has such a structure, the conductive film functions as a stopper film for CMP treatment in a later CMP process in some cases, for example. Alternatively, the end of the CMP treatment can be detected in some cases, so that processing variation can be reduced in some cases.

Figure 6A:
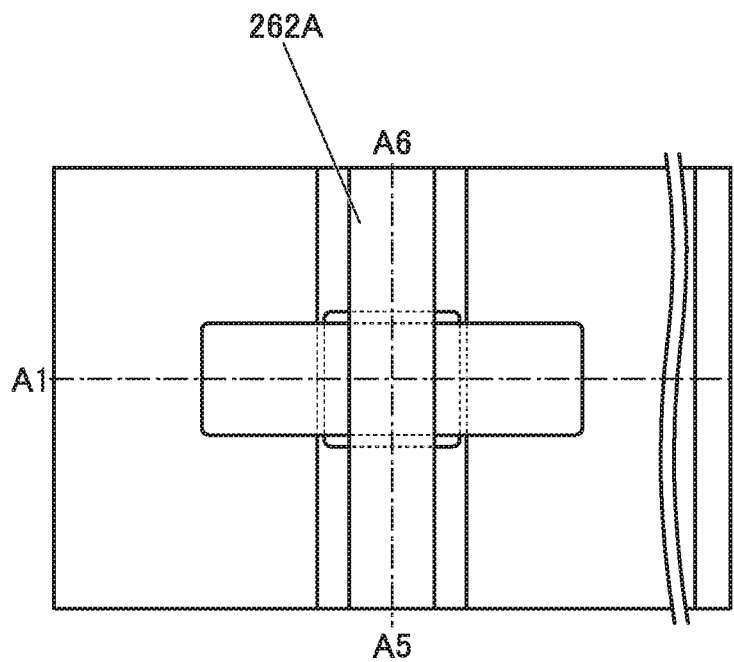
FIG. 6 A top view and cross-sectional views illustrating a method for manufacturing a semiconductor device of one embodiment of the present invention.
Figure 6C:
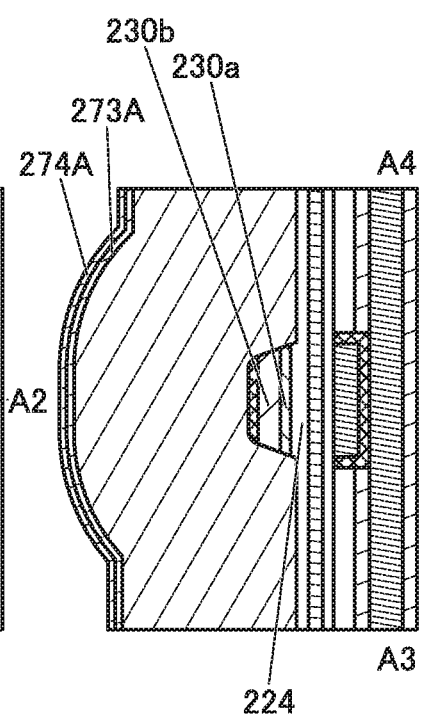
Figure 6B:
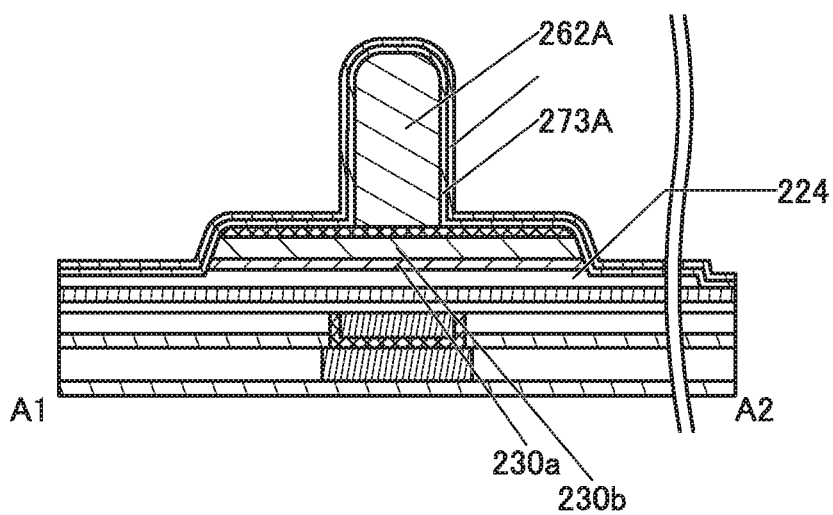

Next, the dummy gate film to be the dummy gate layer 262A is etched by a lithography method to form the dummy gate layer 262A (see FIG. 6). The dummy gate layer 262A is formed to at least partly overlap with the conductor 205, the oxide 230a, and the oxide 230b.

Next, an insulating film 273A is deposited to cover the oxide 230a, the oxide 230b, the conductor 242, and the dummy gate layer 262A. Next, an insulating film 274A may be deposited over the insulating film 273A (see FIG. 6). The insulating film 273A and the insulating film 274A can be deposited by a sputtering method, a CVD method, an MBE method, a PLD method, an ALD method, or the like.

As the insulating film 273A, an insulating film having a function of inhibiting the transmission of oxygen is preferably used. For example, an aluminum oxide film is preferably deposited by a sputtering method. When an aluminum oxide film is deposited by a sputtering method using a gas containing oxygen, oxygen can be injected into the insulator 224. That is, the insulator 224 can contain excess oxygen.

As the insulating film 274A, an insulating film having a function of inhibiting the transmission of oxygen is preferably used. For example, an aluminum oxide film is preferably deposited by an ALD method. By an ALD method which enables good coverage, the insulating film 274A having a uniform thickness can be formed even in a step portion formed by the dummy gate layer 262A and the like. With the use of an ALD method, a dense thin film can be deposited. A dense thin film having good coverage can be deposited in this manner, and thus even when defects such as voids or pinholes are generated in the insulating film 273A, for example, they can be covered with the insulating film 274A.

Thus, excess oxygen contained in the insulator 224 can be prevented from being diffused to the outside, and in addition, impurities such as water and hydrogen can be prevented from entering the insulator 224 from the outside. Note that the deposition of the insulating film 274A can be omitted.

Next, an insulating film to be the insulator 280 is deposited over the insulating film 274A. The insulating film to be the insulator 280 can be deposited by a sputtering method, a CVD method, an MBE method, a PLD method, an ALD method, or the like.

Figure 7A:
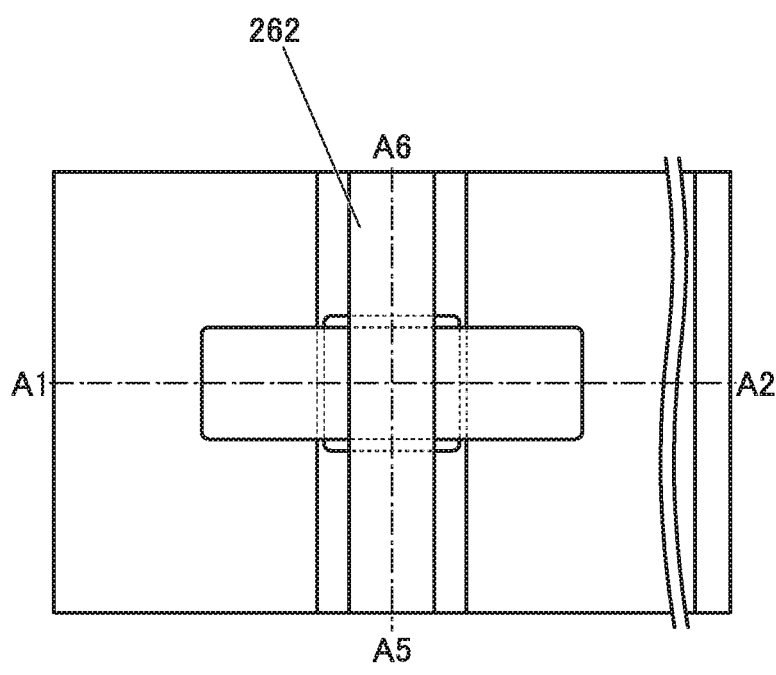
FIG. 7 A top view and cross-sectional views illustrating a method for manufacturing a semiconductor device of one embodiment of the present invention.
Figure 7C:
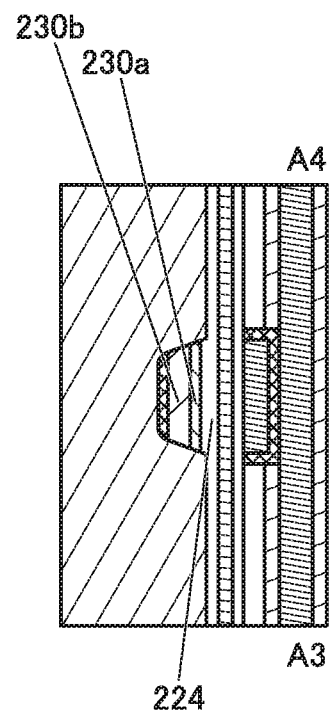
Figure 7B:
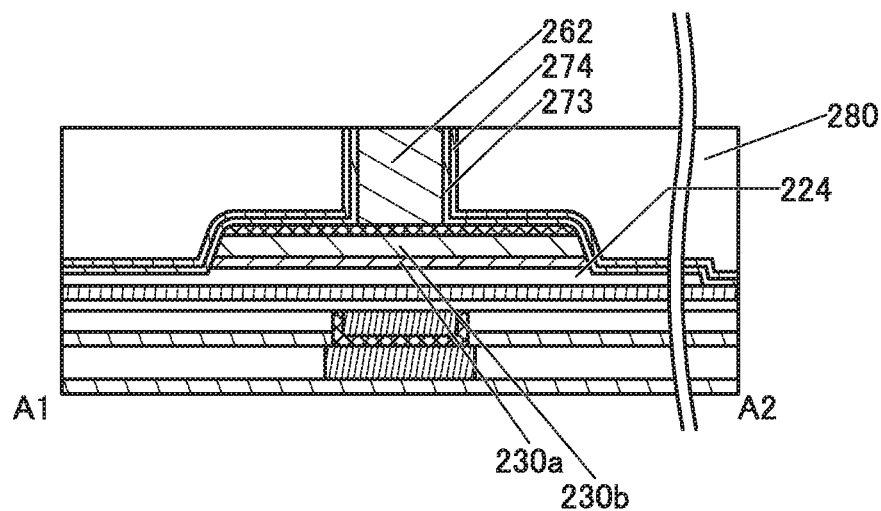
Figure 8A:
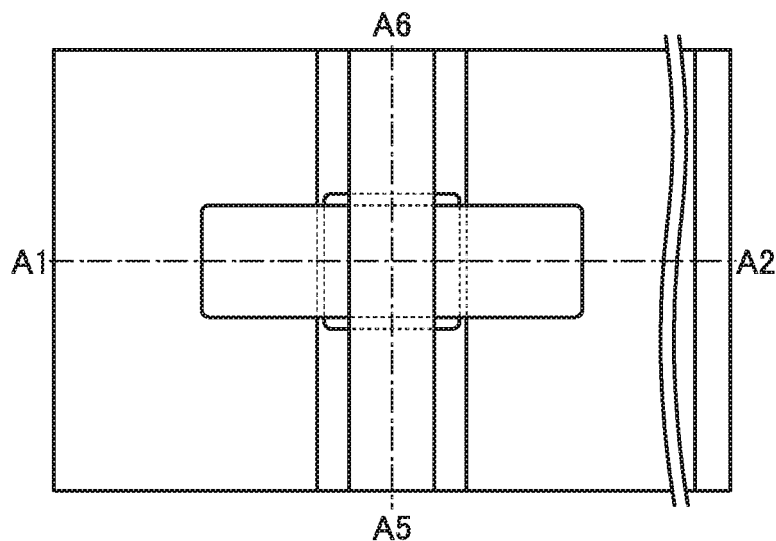
FIG. 8 A top view and cross-sectional views illustrating a method for manufacturing a semiconductor device of one embodiment of the present invention.
Figure 8C:
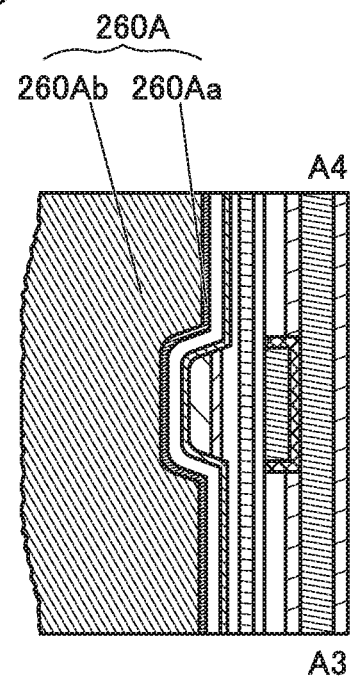
Figure 8B:
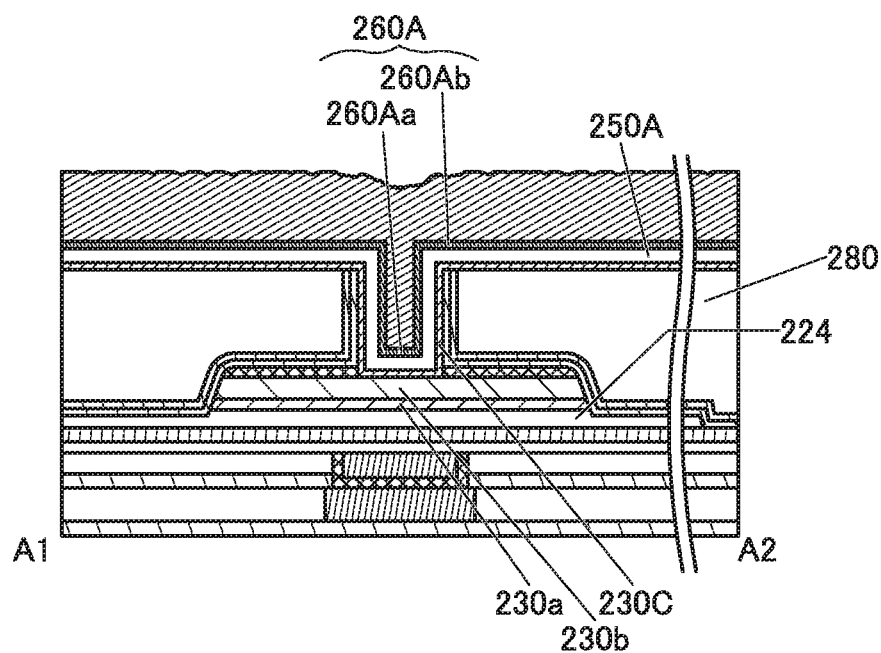

Next, the insulating film to be the insulator 280, the dummy gate layer 262A, the insulating film 273A, and the insulating film 274A are partly removed until part of the dummy gate layer 262A is exposed, and thus, the insulator 280, the dummy gate 262, the insulator 273, and the insulator 274 are formed (see FIG. 7). CMP treatment is preferably employed for forming the insulator 280, the dummy gate 262, the insulator 273, and the insulator 274.

As mentioned above, when the dummy gate layer 262A has a two-layer structure in which a conductive film and a resin film over the conductive film are formed, for example, in CMP treatment, the conductive film functions as a stopper film for the CMP treatment in some cases. Alternatively, the end of the CMP treatment can be detected with the conductive film in some cases, so that variation in the height of the dummy gate 262 can be reduced in some cases. As illustrated in the drawing, the top surface of the dummy gate 262 is substantially aligned with the top surfaces of the insulator 273, the insulator 274, and the insulator 280.

Next, the dummy gate 262 is removed. The dummy gate 262 can be removed by wet etching, dry etching, ashing, or the like. Alternatively, a plurality of the above treatments may be performed in combination as appropriate. For example, wet etching treatment may be performed after ashing treatment. By the removal of the dummy gate 262, a surface of the oxide 230b is partly exposed (see FIG. 8).

Next, an oxide film 230C is deposited. The oxide film 230C can be deposited by a sputtering method, a CVD method, an MBE method, a PLD method, an ALD method, or the like. The oxide film 230C may be deposited by a method similar to that for the oxide film 230A or the oxide film 230B in accordance with characteristics required for the oxide film 230C. In this embodiment, the oxide film 230C is deposited by a sputtering method using a target with In:Ga:Zn=1:3:4 [atomic ratio] or In:Ga:Zn=4:2:4.1 [atomic ratio].

In particular, in the deposition of the oxide film 230C, part of oxygen contained in a sputtering gas is supplied to the oxide 230a and the oxide 230b, in some cases. Therefore, the proportion of oxygen contained in the sputtering gas for the oxide film 230C is preferably 70% or higher, further preferably 80% or higher, still further preferably 100%.

Next, an insulating film 250A is deposited. The insulating film 250A can be deposited by a sputtering method, a CVD method, an MBE method, a PLD method, an ALD method, or the like. For the insulating film 250A, silicon oxynitride is preferably deposited by a CVD method. Note that the deposition temperature at the time of the deposition of the insulating film 250A is preferably higher than or equal to 350° C. and lower than 450° C., particularly preferably approximately 400° C. When the insulating film 250A is deposited at 400° C., an insulator having few impurities can be deposited.

Note that oxygen is excited by microwaves to generate high-density oxygen plasma, and the insulating film 250A is exposed to the oxygen plasma, whereby oxygen can be introduced into the insulating film 250A.

Furthermore, heat treatment may be performed. For the heat treatment, the conditions for the above-described heat treatment can be used. The heat treatment can reduce the moisture concentration and the hydrogen concentration in the insulating film 250A.

Next, a conductive film 260Aa and a conductive film 260Ab are deposited. The conductive film 260Aa and the conductive film 260Ab can be deposited by a sputtering method, a CVD method, an MBE method, a PLD method, an ALD method, or the like. A CVD method is preferably used, for example. In this embodiment, the conductive film 260Aa is deposited by an ALD method, and the conductive film 260Ab is deposited by a CVD method (see FIG. 8).

Figure 9A:
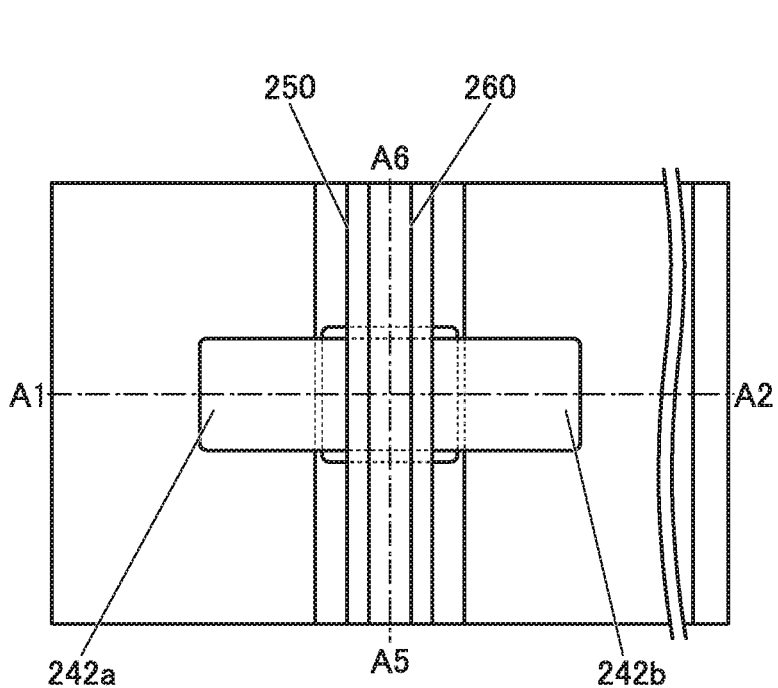
FIG. 9 A top view and cross-sectional views illustrating a method for manufacturing a semiconductor device of one embodiment of the present invention.
Figure 9C:
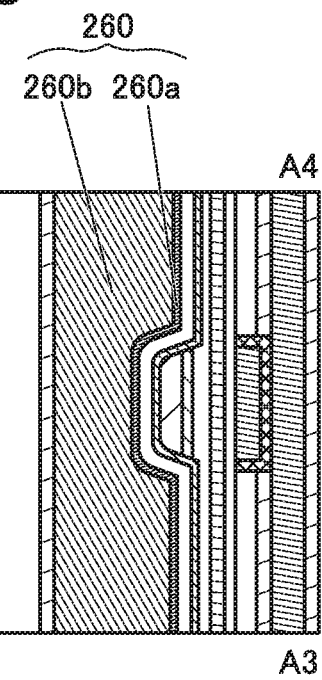
Figure 9B:
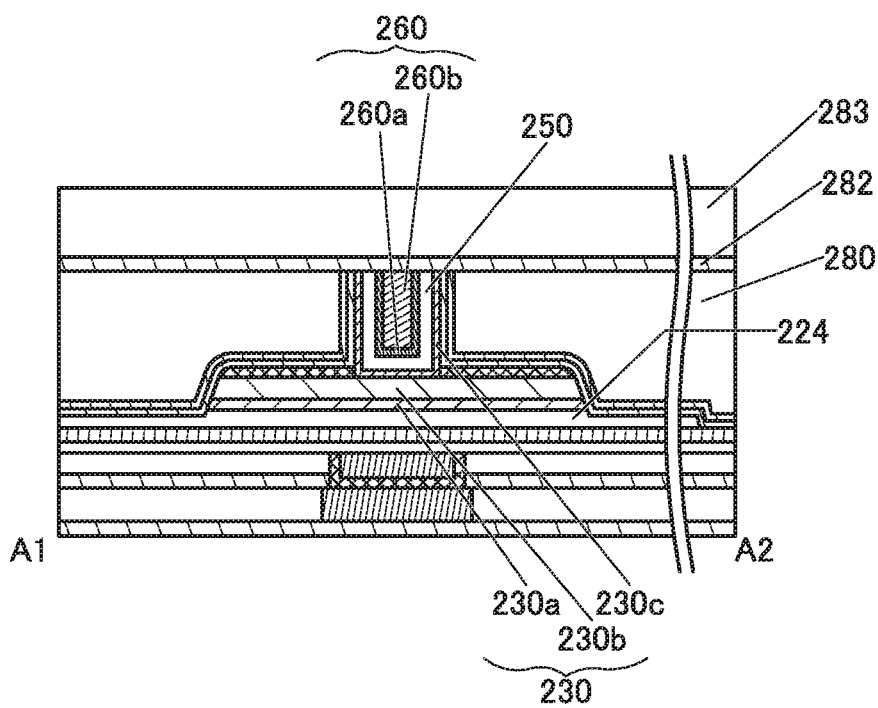

Then, the oxide film 230C, the insulating film 250A, the conductive film 260Aa, and the conductive film 260Ab are polished by CMP treatment until the insulator 280 is exposed, whereby the oxide 230c, the insulator 250, and the conductor 260 (the conductor 260a and the conductor 260b) are formed (see FIG. 9).

Next, an insulating film to be the insulator 282 may be formed over the insulator 280. The insulating film to be the insulator 282 can be deposited by a sputtering method, a CVD method, an MBE method, a PLD method, an ALD method, or the like. An aluminum oxide film is preferably deposited as the insulating film to be the insulator 282 by a sputtering method, for example. When an aluminum oxide film is deposited by a sputtering method, hydrogen contained in the insulator 280 can be prevented from being diffused into the oxide 230 in some cases (see FIG. 9).

Next, an insulator to be the insulator 283 may be deposited over the insulator 282. The insulating film to be the insulator 283 can be deposited by a sputtering method, a CVD method, an MBE method, a PLD method, an ALD method, or the like (see FIG. 9).

Next, openings reaching the conductor 242a and the conductor 242b are formed in the insulator 273, the insulator 274, the insulator 280, the insulator 282, and the insulator 283. The openings may be formed by a lithography method.

Next, a conductive film to be the conductor 240a and the conductor 240b is deposited. The conductive film to be the conductor 240a and the conductor 240b desirably has a stacked-layer structure which includes a conductor having a function of inhibiting the transmission of impurities such as water and hydrogen. For example, stacked layers of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Next, CMP treatment is performed to remove part of the conductive film to be the conductor 240a and the conductor 240b, so that the insulator 283 is exposed. As a result, the conductive film remains only in the openings, so that the conductor 240a and the conductor 240b having flat top surfaces can be formed (see FIG. 1).

The conductor 240a and the conductor 240b may be formed after aluminum oxide is formed on side wall portions of the openings. By forming aluminum oxide on the side wall portions of the openings, the transmission of oxygen from the outside can be inhibited and oxidation of the conductor 240a and the conductor 240b can be prevented. Furthermore, impurities such as water and hydrogen can be prevented from being diffused from the conductor 240a and the conductor 240b to the outside. The aluminum oxide can be formed by depositing aluminum oxide in the opening by an ALD method or the like and then performing anisotropic etching.

Through the above process, the semiconductor device including the transistor 200 illustrated in FIG. 1 can be manufactured. As illustrated in FIG. 4 to FIG. 9, with the use of the method for manufacturing the semiconductor device described in this embodiment, the transistor 200 can be formed.

<Modification Example of Semiconductor Device>

An example of a semiconductor device including the transistor 200 of one embodiment of the present invention which is different from the semiconductor device described in <Structure example of semiconductor device> above will be described below with reference to FIG. 10 to FIG. 11.

Figures (A) are top views of the semiconductor device including the transistor 200. Moreover, figures (B) are cross-sectional views of a portion indicated by a dashed-dotted line A1-A2 in (A), and are also cross-sectional views in the channel length direction of the transistor 200. Figures (C) are cross-sectional views of a portion indicated by a dashed-dotted line A3-A4 in (A), and are also cross-sectional views in the channel width direction of the transistor 200. For clarity of the drawing, some components are not illustrated in the top views of figures (A).

Figure 10A:
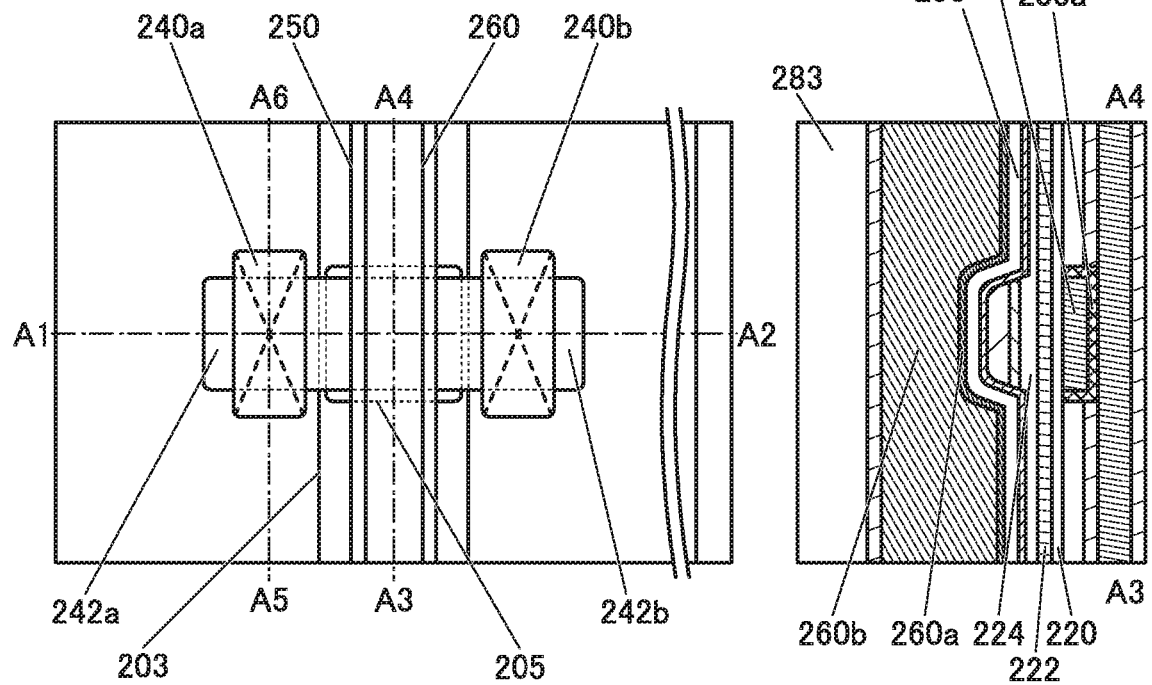
FIG. 10 A top view and cross-sectional views of a semiconductor device of one embodiment of the present invention.
Figure 10C:
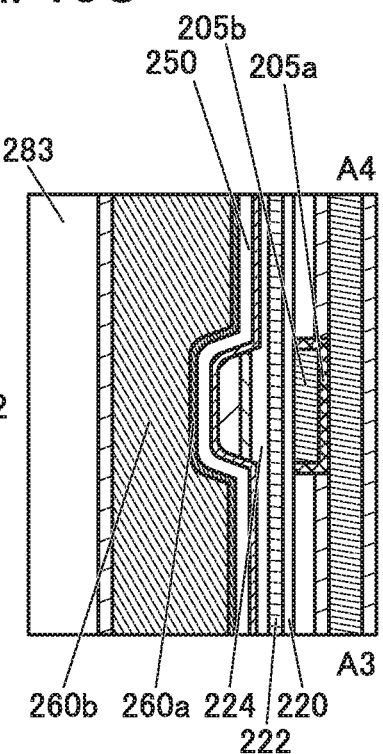
Figure 10B:
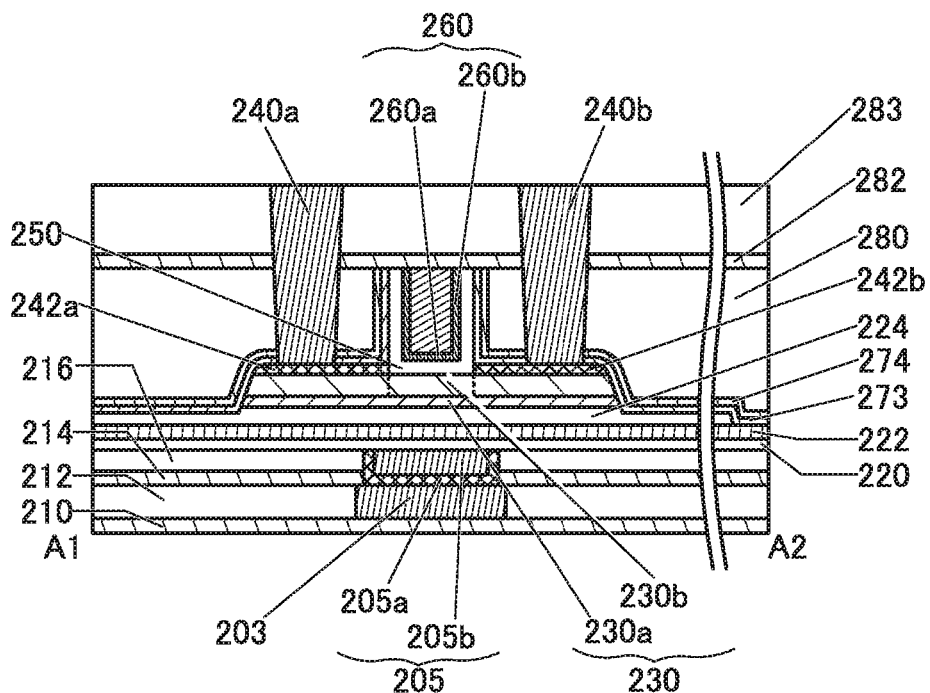
Figure 11A:
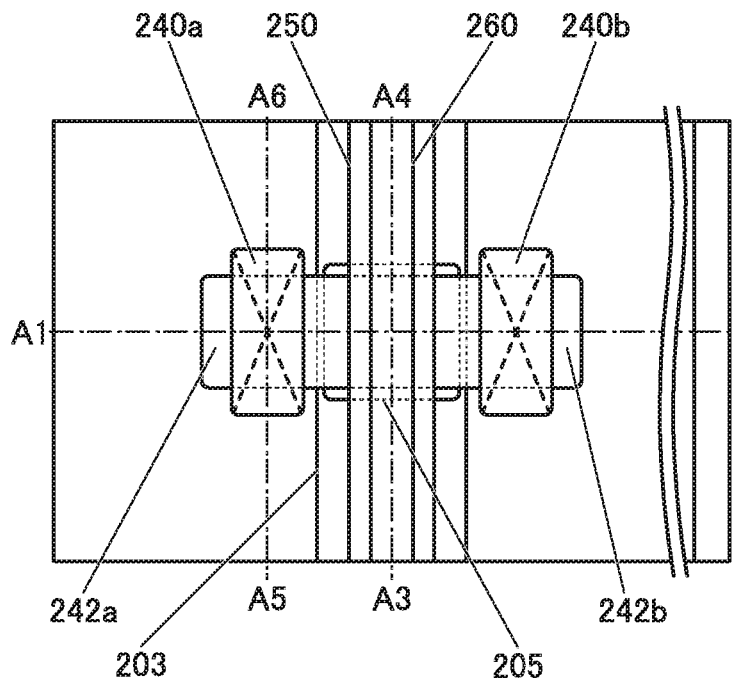
FIG. 11 A top view and cross-sectional views of a semiconductor device of one embodiment of the present invention.
Figure 11C:
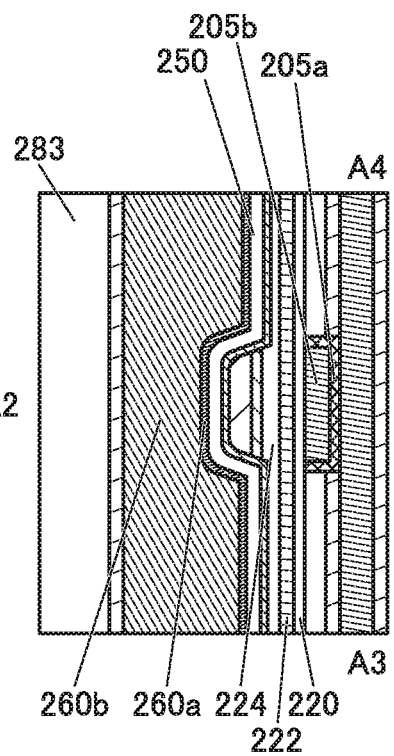
Figure 11B:
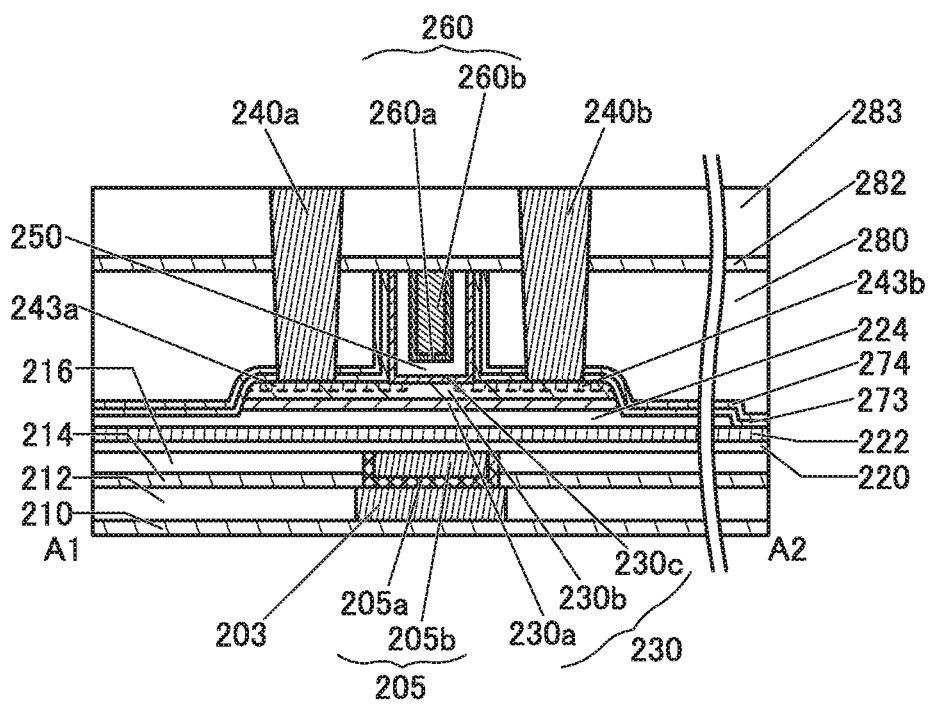

Note that in the semiconductor devices illustrated in FIG. 10 and FIG. 11, components having the same functions as the components in the semiconductor device described in <Structure example of semiconductor device> (see FIG. 1) are denoted by the same reference numerals.

A structure of the transistor 200 will be described with reference to FIG. 10 below. Note that also in this section, the materials described in detail in <Structure example of semiconductor device> can be used as the materials for the transistor 200.

The semiconductor device illustrated in FIG. 10 is different from the semiconductor device described in <Structure example of semiconductor device> (see FIG. 1) in that the oxide 230c is not provided. The semiconductor device illustrated in FIG. 1 can be referred to for the other structures and the effect.

The transistor 200 illustrated in FIG. 11 is different from the transistor 200 illustrated in FIG. 1 in that the conductor 242 is not provided. In the transistor 200 illustrated in FIG. 11, a region 243 (a region 243a and a region 243b) may be formed by adding as a dopant an element that can increase the carrier density of the oxide 230 and reduce the resistance thereof.

As the dopant, an element that forms an oxygen vacancy, an element that is bonded to an oxygen vacancy, or the like is used. Typical examples of the element include boron and phosphorus. Moreover, hydrogen, carbon, nitrogen, fluorine, sulfur, chlorine, titanium, a rare gas, or the like may be used. Typical examples of the rare gas include helium, neon, argon, krypton, and xenon. Furthermore, any one or more metal elements selected from metal elements such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum may be added. Among the above, boron and phosphorus are preferable as a dopant. In the case where boron or phosphorus is used as a dopant, manufacturing line apparatuses for amorphous silicon or low-temperature polysilicon can be used; thus, capital investment can be reduced. The concentration of the element is measured by SIMS or the like.

In particular, an element that easily forms an oxide is preferably used as an element to be added to the region 243. Typical examples of the element include boron, phosphorus, aluminum, and magnesium. The element added to the region 243 can deprive oxygen in the oxide 230 to form an oxide. As a result, many oxygen vacancies are generated in the region 243. When the oxygen vacancies and hydrogen in the oxide 230 are bonded to each other, carriers are generated, and accordingly, a region with extremely low resistance is formed. The element added to the region 243 exists in the state of a stable oxide in the region 243; thus, even when treatment that requires a high temperature is performed in a later step, the element is not easily released from the region 243. That is, the use of an element that easily forms an oxide as an element to be added to the region 243 enables formation of a region whose resistance is not easily increased even through a high-temperature process, in the oxide 230.

The formation of the region 243 functioning as the source region or the drain region in the oxide 230 enables the conductor 240 functioning as a plug to be connected to the region 243 without providing a source electrode and a drain electrode that are formed of metal.

In the case where the region 243 is formed by addition of a dopant, for example, a mask such as a resist mask or a hard mask is provided in a position to be the channel formation region of the transistor 200 and addition of a dopant is performed. In that case, the region 243 containing the element can be formed in a region of the oxide 230 that does not overlap with the mask.

As a method for adding a dopant, an ion implantation method in which an ionized source gas is subjected to mass separation and then added, an ion doping method in which an ionized source gas is added without mass separation, a plasma immersion ion implantation method, or the like can be used. In the case of performing mass separation, an ion species to be added and its concentration can be adjusted precisely. On the other hand, in the case of not performing mass separation, ions at a high concentration can be added in a short time. Alternatively, an ion doping method in which atomic or molecular clusters are generated and ionized may be used. Note that a dopant may be referred to as an ion, donor, acceptor, impurity, element, or the like.

By adding an element that forms an oxygen vacancy to the region 243 and performing heat treatment, hydrogen contained in the region 234 functioning as a channel formation region can be trapped by an oxygen vacancy included in the region 243, in some cases. Thus, the transistor 200 can have stable electrical characteristics and increased reliability.

The structure, composition, method, and the like described above in this embodiment can be used in appropriate combination with the structures, compositions, methods, and the like described in the other embodiments.

Embodiment 2

In this embodiment, one embodiment of a semiconductor device will be described with reference to FIG. 12 and FIG. 13.

[Memory Device 1]

Figure 12:
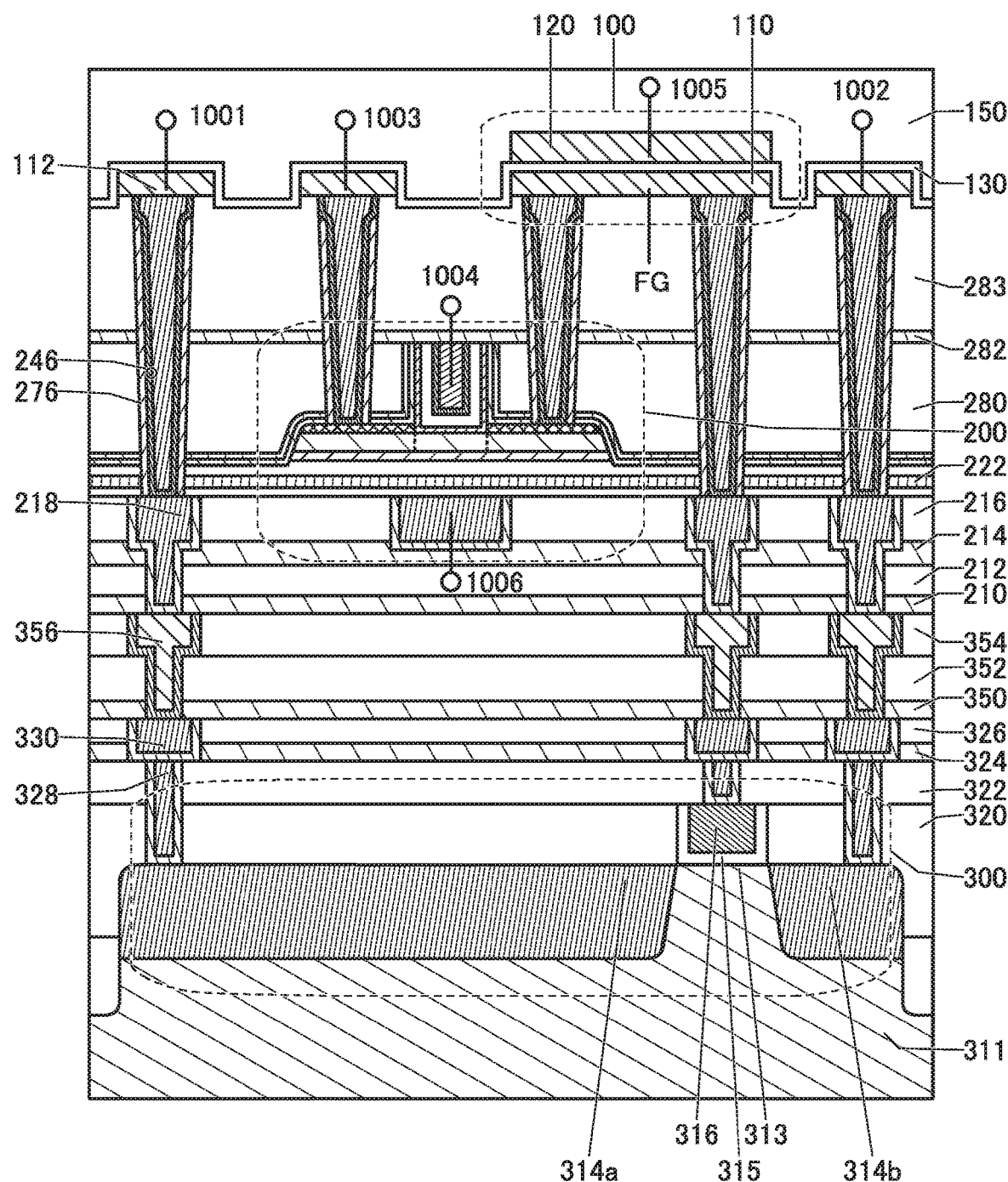
FIG. 12 A cross sectional view illustrating a structure of a memory device of one embodiment of the present invention.

FIG. 12 illustrates an example of a semiconductor device (memory device) in which the capacitor of one embodiment of the present invention is used. In the semiconductor device of one embodiment of the present invention, the transistor 200 is provided above a transistor 300, and a capacitor 100 is provided above the transistor 300 and the transistor 200. Note that the transistor 200 described in the above embodiment can be used as the transistor 200.

The transistor 200 is a transistor whose channel is formed in a semiconductor layer containing an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device.

In the semiconductor device illustrated in FIG. 12, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to a first gate of the transistor 200. A wiring 1006 is electrically connected to a second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

By arranging the memory devices illustrated in FIG. 12 in a matrix, a memory cell array can be formed.

<Transistor 300>

The transistor 300 is provided over a substrate 311 and includes a conductor 316 functioning as a gate, an insulator 315 functioning as a gate insulator, a semiconductor region 313 that is a part of the substrate 311, and a low-resistance region 314a and a low-resistance region 314b functioning as the source region and the drain region. The transistor 300 is of either a p-channel type or an n-channel type.

In the transistor 300 illustrated in FIG. 12, the semiconductor region 313 (part of the substrate 311) in which a channel is formed has a convex shape. Furthermore, the conductor 316 is provided so as to cover a side surface and top surface of the semiconductor region 313 with the insulator 315 positioned therebetween. Note that a material for adjusting the work function may be used for the conductor 316. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 12 is an example and the structure is not limited thereto; an appropriate transistor is used in accordance with a circuit configuration or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 over the conductor 246 can be formed at the same time. Note that the conductor 112 has a function of a plug or a wiring that is electrically connected to the capacitor 100, the transistor 200, or the transistor 300.

Although the conductor 112 and the conductor 110 having a single-layer structure are illustrated in FIG. 12, the structure is not limited thereto; a stacked-layer structure of two or more layers may be employed. For example, between a conductor having a barrier property and a conductor having high conductivity, a conductor which is highly adhesive to the conductor having a barrier property and the conductor having high conductivity may be formed.

The insulator 130 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

For example, the insulator 130 preferably has a stacked-layer structure using a material with high dielectric strength such as silicon oxynitride and a high dielectric constant (high-k) material. In the capacitor 100 having such a structure, a sufficient capacitance can be provided owing to the high-k insulator, and the dielectric strength can be increased owing to the insulator with high dielectric strength, so that the electrostatic breakdown of the capacitor 100 can be prevented.

Examples of the insulator with a high-k material include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

As the material having a high dielectric strength (a material having a low dielectric constant), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

<Wiring Layers>

Wiring layers provided with an interlayer film, a wiring, a plug, and the like may be provided between the structure bodies. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and an insulator 326 are stacked over the transistor 300 in this order as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as plugs or wirings.

The insulator functioning as an interlayer film may function as a planarization film that covers an uneven shape thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 12, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor 218, a conductor (the conductor 205) included in the transistor 200, and the like are embedded in the insulator 210, the insulator 212, the insulator 214, and the insulator 216. Note that the conductor 218 has a function of a plug or a wiring that is electrically connected to the capacitor 100 or the transistor 300. In addition, the insulator 150 is provided over the conductor 120 and the insulator 130.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low dielectric constant is used for the insulator functioning as an interlayer film, the parasitic capacitance generated between wirings can be reduced. Thus, a material is preferably selected depending on the function of an insulator.

For example, the insulator 150, the insulator 212, the insulator 352, the insulator 354, and the like preferably include an insulator having a low dielectric constant. For example, the insulators each preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low dielectric constant. Examples of the resin include polyester, polyolefin, polyamide (e.g., nylon and aramid), polyimide, polycarbonate, and acrylic When the transistor using an oxide semiconductor is surrounded by an insulator that has a function of inhibiting the transmission of oxygen and impurities such as hydrogen, the electrical characteristics of the transistor can be stable. Thus, an insulator having a function of inhibiting the transmission of oxygen and impurities such as hydrogen is preferably used for the insulator 210, the insulator 350, and the like.

As an insulator having a function of inhibiting the transmission of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, for the insulator having a function of inhibiting the transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductors that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, and the like, a single layer or a stacked layer of a conductive material such as a metal material, an alloy material, a metal nitride material, or a metal oxide material which is formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<<Wirings or Plugs in a Layer Provided with an Oxide Semiconductor>>

In the case where an oxide semiconductor is used in the transistor 200, an insulator including an excess oxygen region is provided in the vicinity of the oxide semiconductor in some cases. In that case, an insulator having a barrier property is preferably provided between the insulator including the excess oxygen region and the conductor provided in the insulator including the excess oxygen region.

For example, an insulator 276 is preferably provided between the insulator 224 and the conductor 246 in FIG. 12. In particular, the insulator 276 is preferably provided in contact with the insulator 224 containing an excess oxygen region, and the insulator 222, the insulator 273, and the insulator 274 which sandwich the insulator 224. Since the insulator 276 is provided in contact with the insulator 222 and the insulator 283, the insulator 224 and the transistor 200 can be sealed by the insulators having a barrier property. It is also preferable that the insulator 276 be in contact with part of the insulator 280. When the insulator 276 extends to the insulator 280, diffusion of oxygen and impurities can be further inhibited.

That is, when the insulator 276 is provided, absorption of excess oxygen contained in the insulator 222 by the conductor 246 can be inhibited. In addition, when the insulator 276 is included, diffusion of hydrogen, which is an impurity, into the transistor 200 through the conductor 246 can be inhibited.

For the insulator 276, an insulating material having a function of inhibiting diffusion of oxygen and impurities such as water and hydrogen is preferably used. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The above is the description of the structure example. With the use of the structure, a change in electrical characteristics can be reduced and reliability can be improved in a semiconductor device using a transistor including an oxide semiconductor. Alternatively, a transistor including an oxide semiconductor with a high on-state current can be provided. Alternatively, a transistor including an oxide semiconductor with low off-state current can be provided. Alternatively, a semiconductor device with low power consumption can be provided.

[Memory Device 2]

Figure 13:
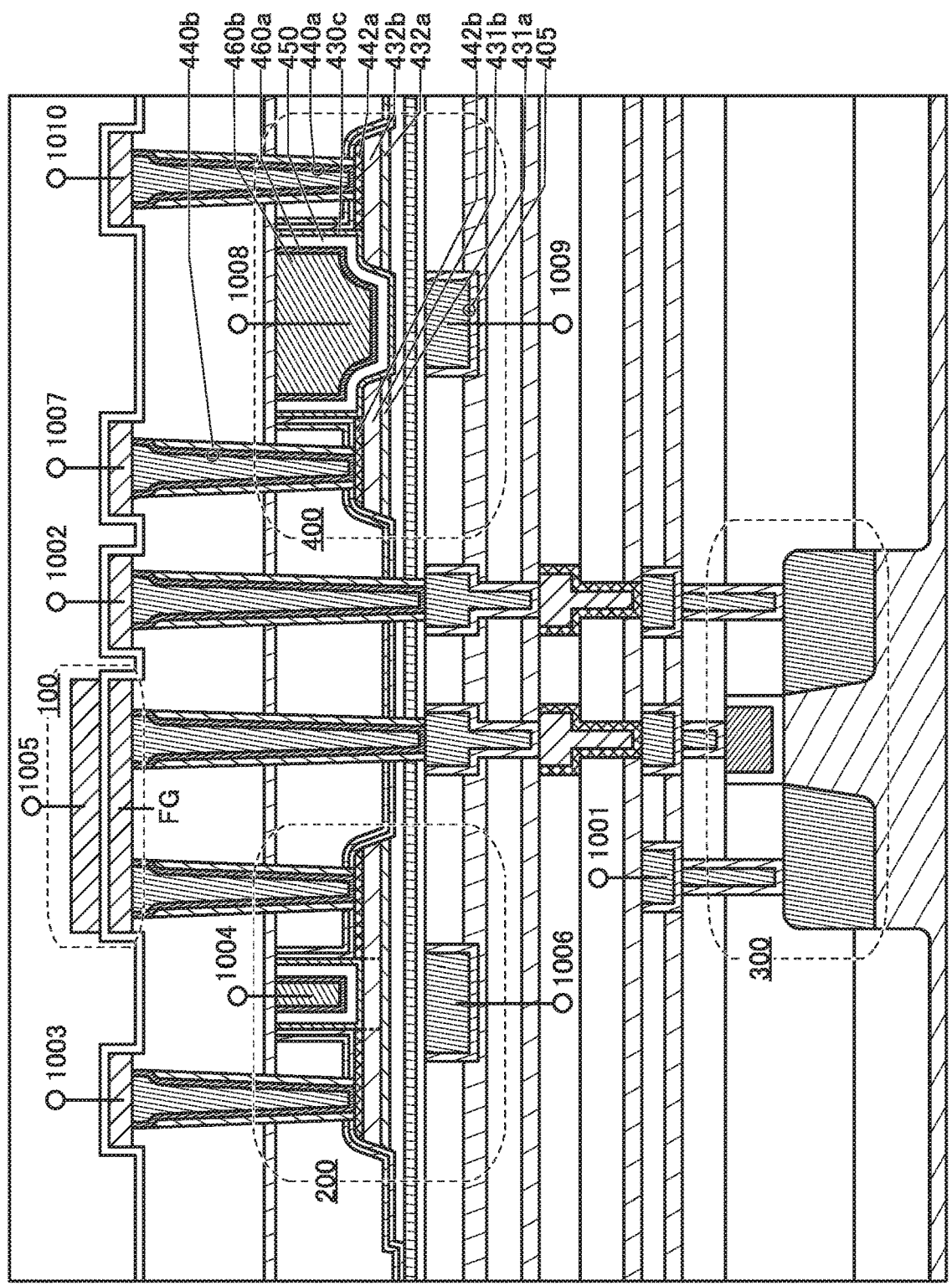
FIG. 13 A cross-sectional view illustrating a structure of a memory device of one embodiment of the present invention.

FIG. 13 illustrates an example of a memory device using the semiconductor device of one embodiment of the present invention. The memory device illustrated in FIG. 13 includes a transistor 400 in addition to the semiconductor device including the transistor 200, the transistor 300, and the capacitor 100 illustrated in FIG. 12.

The transistor 400 can control a second gate voltage of the transistor 200. For example, a first gate and a second gate of the transistor 400 are diode-connected to a source of the transistor 400, and the source thereof is connected to the second gate of the transistor 200. When a negative potential of the second gate of the transistor 200 is retained in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistor 200 and the transistor 400. Accordingly, the memory device including the transistor 200 and the transistor 400 can retain stored data for a long time.

In FIG. 13, the wiring 1001 is electrically connected to the source of the transistor 300. The wiring 1002 is electrically connected to the drain of the transistor 300. The wiring 1003 is electrically connected to one of the source and the drain of the transistor 200. The wiring 1004 is electrically connected to the gate of the transistor 200. The wiring 1006 is electrically connected to a back gate of the transistor 200. The gate of the transistor 300 and the other of the source and the drain of the transistor 200 are electrically connected to one electrode of the capacitor 100. The wiring 1005 is electrically connected to the other electrode of the capacitor 100. A wiring 1007 is electrically connected to the source of the transistor 400. A wiring 1008 is electrically connected to a gate of the transistor 400. A wiring 1009 is electrically connected to a back gate of the transistor 400. A wiring 1010 is electrically connected to the drain of the transistor 400. The wiring 1006, the wiring 1007, the wiring 1008, and the wiring 1009 are electrically connected to each other.

When the memory devices illustrated in FIG. 13 are arranged in a matrix like the memory devices illustrated in FIG. 12, a memory cell array can be formed. Note that one transistor 400 can control second gate voltages of the transistors 200. For this reason, the number of provided transistors 400 is preferably smaller than the number of transistors 200.

[Transistor 400]

The transistor 400 and the transistors 200 are formed in the same layer and thus can be fabricated in parallel. The transistor 400 includes a conductor 460 (a conductor 460a and a conductor 460b) functioning as a first gate; a conductor 405 functioning as a second gate; the insulator 220, the insulator 222, the insulator 224, and an insulator 450 each functioning as a gate insulating layer; an oxide 430c including a region where a channel is formed; a conductor 442a functioning as one of a source and a drain; an oxide 431a and an oxide 431b; a conductor 442b functioning as the other of the source and the drain; an oxide 432a and an oxide 432b; and a conductor 440 (a conductor 440a and a conductor 440b).

In the transistor 400, the conductor 405 is in the same layer as the conductor 205. The oxide 431a and the oxide 432a are in the same layer as the oxide 230a, and the oxide 431b and the oxide 432b are in the same layer as the oxide 230b. The conductor 442 is in the same layer as the conductor 242. The oxide 430c is in the same layer as the oxide 230c. The insulator 450 is in the same layer as the insulator 250. The conductor 460 is in the same layer as the conductor 260.

Note that the structure bodies formed in the same layer can be formed at the same time. For example, the oxide 430c can be formed by processing an oxide film to be the oxide 230c.

In the oxide 430c functioning as an active layer of the transistor 400, oxygen vacancies and impurities such as hydrogen and water are reduced, as in the oxide 230 or the like. Accordingly, the threshold voltage of the transistor 400 can be higher than 0 V, an off-state current can be reduced, and the drain current when the second gate voltage and the first gate voltage are 0 V can be extremely low.

<Dicing Line>

A dicing line (also referred to as a scribe line, a dividing line, or a cutting line in some cases) that is provided when a large-sized substrate is divided into semiconductor elements so that a plurality of semiconductor devices are each formed in a chip form will be described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 13, it is preferable to perform design so that a region in which the insulator 273 and the insulator 222 are in contact with each other is the dicing line. That is, an opening is provided in the insulator 224 in the vicinity of the region to be the dicing line that is provided in an outer edge of the transistor 400 and the memory cell including a plurality of transistors 200. The insulator 273 and the insulator 274 are provided to cover the side surface of the insulator 224.

That is, in the opening provided in the insulator 224, the insulator 222 is in contact with the insulator 273. For example, the insulator 222 and the insulator 273 may be formed using the same material and the same method. When the insulator 222 and the insulator 273 are formed using the same material and the same method, the adhesion therebetween can be increased. For example, aluminum oxide is preferably used.

With such a structure, the insulator 224, the transistor 200 and the transistor 400 can be enclosed with the insulator 222 and the insulator 273. Since the insulator 222 and the insulator 273 have a function of inhibiting diffusion of oxygen, hydrogen, and water even when the substrate is divided into circuit regions each of which is provided with the semiconductor elements in this embodiment to form a plurality of chips, the entry and diffusion of impurities such as hydrogen and water from the direction of a side surface of the divided substrate to the transistor 200 and the transistor 400 can be inhibited.

Furthermore, in the structure, excess oxygen in the insulator 224 can be inhibited from being diffused into the outside of the insulator 273 and the insulator 222. Accordingly, excess oxygen in the insulator 224 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, a change in electrical characteristics of the transistors 200 or the transistor 400 can be inhibited and reliability can be improved.

This embodiment can be implemented in an appropriate combination with the structures described in the other embodiments and the like.

Embodiment 3

In this embodiment, a memory device of one embodiment of the present invention including a transistor in which an oxide is used for a semiconductor (hereinafter referred to as an OS transistor in some cases) and a capacitor (hereinafter, such a memory device is also referred to as an OS memory device in some cases), will be described with reference to FIG. 14 and FIG. 15. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 14A:
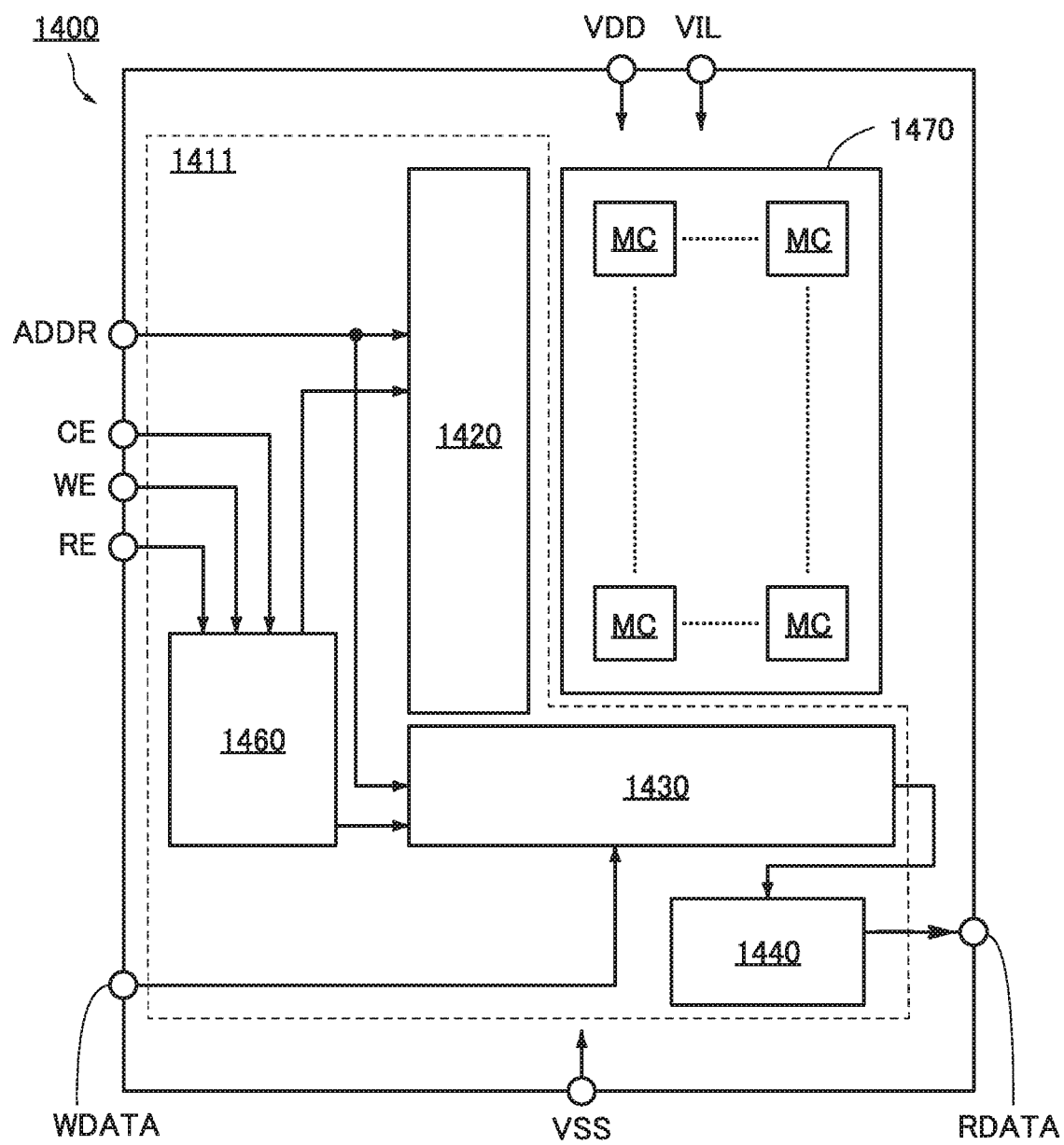
FIG. 14 A block diagram illustrating a structure example of a memory device of one embodiment of the present invention.

FIG. 14A illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later in detail.

The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the WDATA is input to the write circuit.

The control logic circuit 1460 processes the signals (CE, WE, and RE) input from the outside, and generates control signals for the row decoder and the column decoder. The CE is a chip enable signal, the WE is a write enable signal, and the RE is a read enable signal. Signals processed by the control logic circuit 1460 are not limited thereto, and other control signals may be input as necessary.

The memory cell array 1470 includes a plurality of memory cells MC and a plurality of wirings arranged in a matrix. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 14B:
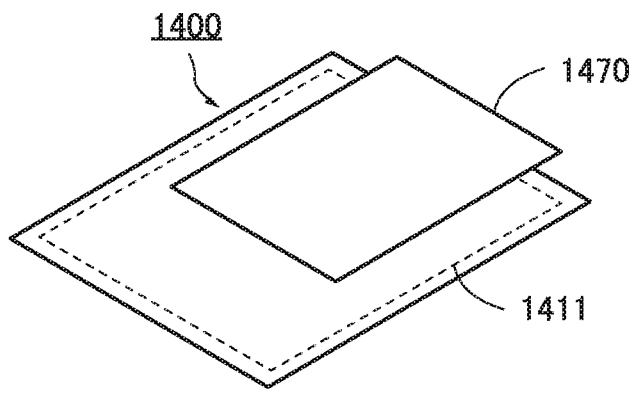

Note that FIG. 14(A) illustrates an example in which the peripheral circuit 1411 and the memory cell array 1470 are formed on the same plane; however, this embodiment is not limited thereto. For example, as illustrated in FIG. 14(B), the memory cell array 1470 may be provided over the peripheral circuit 1411 to partly overlap with the peripheral circuit 1411. For example, the sense amplifier may be provided below the memory cell array 1470 so that they overlap with each other.

FIG. 15 illustrate structure examples of a memory cell applicable to the memory cell MC.

[DOSRAM]

Figure 15A:
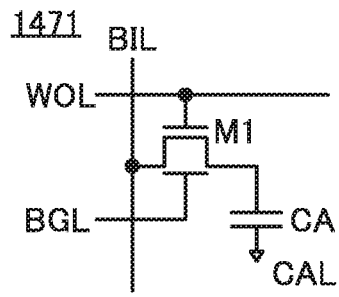
FIG. 15 Circuit diagrams illustrating structure examples of a memory device of one embodiment of the present invention.
Figure 15B:
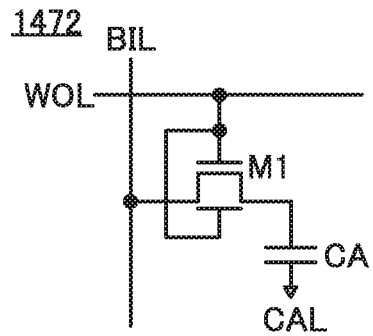
Figure 15C:
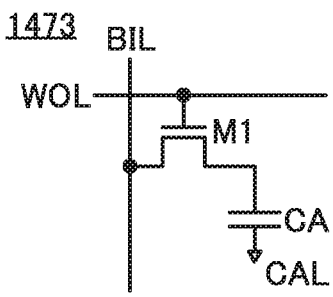
Figure 15D:
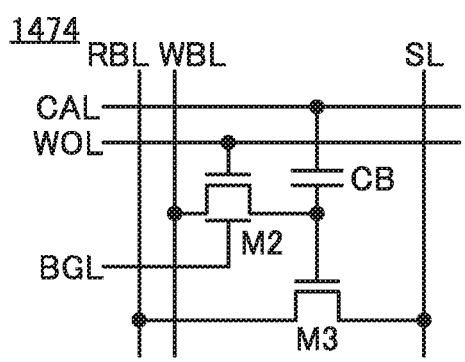
Figure 15E:
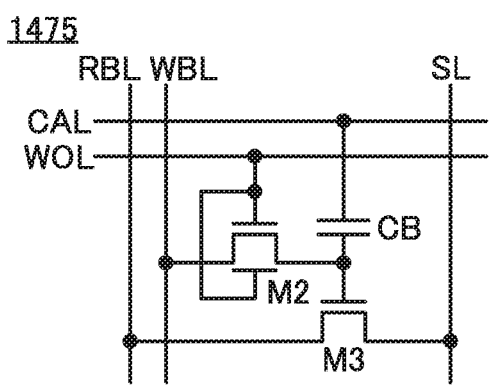
Figure 15F:
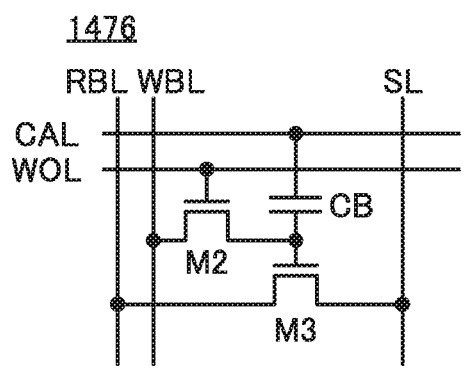
Figure 15G:
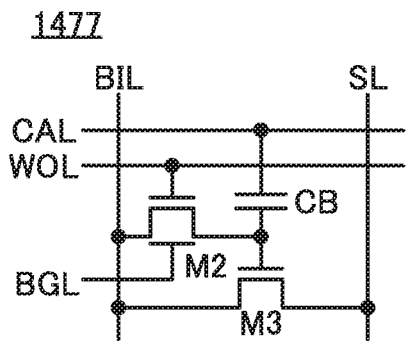

FIGS. 15(A) to 15(C) each illustrate a circuit structure example of a memory cell of a DRAM. In this specification and the like, a DRAM using a memory cell including one OS transistor and one capacitor is referred to as DOSRAM (Dynamic Oxide Semiconductor Random Access Memory) in some cases. A memory cell 1471 illustrated in FIG. 15(A) includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be amplified.

The memory cell MC is not limited to the memory cell 1471, and the circuit structure can be changed. For example, as in a memory cell 1472 illustrated in FIG. 15(B), the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 illustrated in FIG. 15(C).

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of the refresh operation for the memory cell can be decreased. In addition, refresh operation of the memory cell can be unnecessary. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

[NOSRAM]

FIGS. 15(D) to 15(G) each illustrate a circuit structure example of a gain-cell memory cell including two transistors and one capacitor. A memory cell 1474 illustrated in FIG. 15(D) includes a transistor M2, a transistor M3, and a capacitor CB. Note that the transistor M2 includes a front gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be amplified.

The memory cell MC is not limited to the memory cell 1474, and the circuit structure can be changed as appropriate. For example, as in a memory cell 1475 illustrated in FIG. 15(E), the back gate of the transistor M2 may be connected not to the wiring BGL but to the wiring WOL in the memory cell MC. Alternatively, for example, the memory cell MC may be a memory cell including as single-gate transistor, that is, the transistor M2 not including a back gate, as in a memory cell 1476 illustrated in FIG. 15(F). Alternatively, for example, in the memory cell MC, the wiring WBL and the wiring RBL may be combined into one wiring BIL, as in a memory cell 1477 illustrated in FIG. 15(G).

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. That is, with the use of the transistor M2, written data can be retained for a long time, and thus the frequency of the refresh operation for the memory cell can be decreased. In addition, refresh operation of the memory cell can be unnecessary. In addition, since the transistor M2 has an extremely low leakage current, multi-level data or analog data can be retained in the memory cell 1474. The same applies to the memory cells 1475 to 1477.

Note that the transistor M3 may be a transistor containing silicon in a channel formation region (hereinafter, also referred to as a Si transistor in some cases). The conductivity type of the Si transistor may be of either an n-channel type or a p-channel type. The Si transistor has higher field-effect mobility than the OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

Alternatively, the transistor M3 may be an OS transistor. When an OS transistor is used as each of the transistors M2 and M3, the circuit of the memory cell array 1470 can be formed using only n-channel transistors.

Figure 15H:
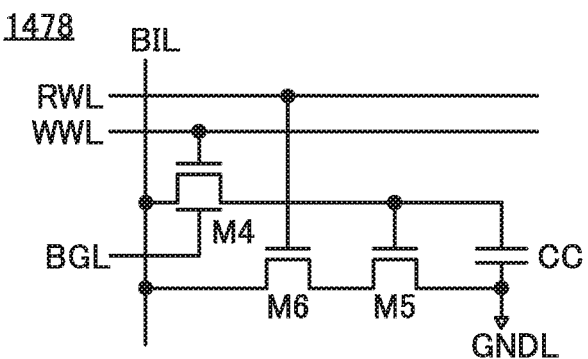

FIG. 15(H) illustrates an example of a gain-cell memory cell including three transistors and one capacitor. A memory cell 1478 illustrated in FIG. 15(H) includes transistors M4 to M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate that is electrically connected to the wiring BGL. Note that the back gate and the gate of the transistor M4 may be electrically connected to each other. Alternatively, the transistor M4 may not include the back gate.

Note that each of the transistors M5 and M6 may be an n-channel Si transistor or a p-channel Si transistor. Alternatively, the transistors M4 to M6 may be OS transistors, in which case the circuit of the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistors M5 and M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. Positions and functions of these circuits, wirings connected to the circuits, circuit elements, and the like can be changed, deleted, or added as needed.

The structure described in this embodiment can be used in an appropriate combination with the structures described in the other embodiments and the like.

Embodiment 4

In this embodiment, an example of a chip 1200 on which the semiconductor device of the present invention is mounted will be described with reference to FIG. 16. A plurality of circuits (systems) are mounted on the chip 1200. The technique for integrating a plurality of circuits (systems) on one chip as described above is referred to as system on chip (SoC) in some cases.

Figure 16A:
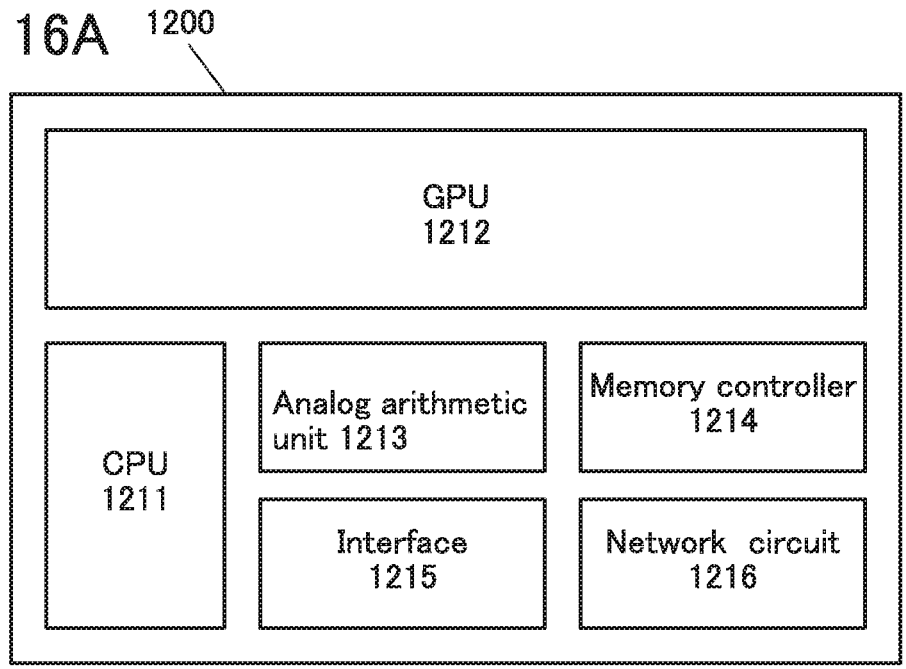
FIG. 16 Schematic views of a semiconductor device of one embodiment of the present invention.

As illustrated in FIG. 16(A), the chip 1200 includes a CPU (Central Processing Unit) 1211, a GPU (Graphics Processing Unit) 1212, one or more of analog arithmetic units 1213, one or more of memory controllers 1214, one or more of interfaces 1215, one or more of network circuits 1216, and the like.

Figure 16B:
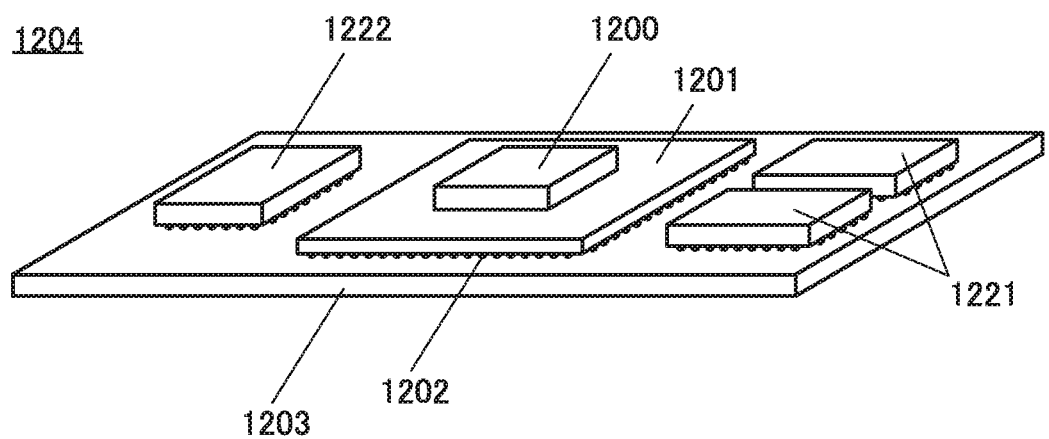

A bump (not illustrated) is provided on the chip 1200, and as illustrated in FIG. 16(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement the arithmetic operation in a deep neural network (DNN), a convolutional neural network (CNN), a recurrent neural network (RNN), an autoencorder, a deep Boltzmann machine (DBM), a deep belief network (DBN), or the like; thus, the chip 1200 can be used as an AI chip or the GPU module 1204 can be used as an AI system module.

The structure described in this embodiment can be used in an appropriate combination with the structures described in the other embodiments.

Embodiment 5

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 17 schematically illustrates some structure examples of removable memory devices. The semiconductor device described in the above embodiment is processed into a packaged memory chip and used in a variety of storage devices and removable memories, for example.

Figure 17A:
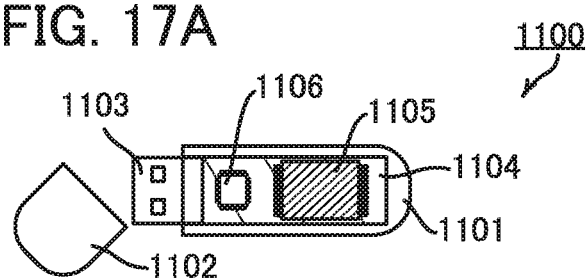
FIG. 17 Schematic views of a memory device of one embodiment of the present invention.

FIG. 17(A) is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104.

The semiconductor device described in the above embodiment can be incorporated in the memory chip 1105 or the like on the substrate 1104.

Figure 17B:
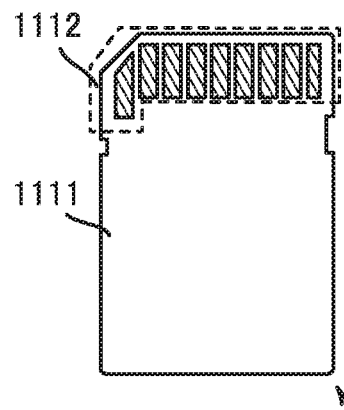
Figure 17C:
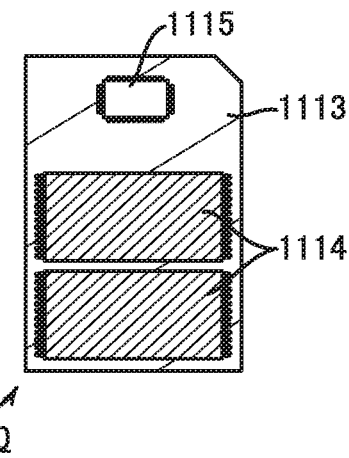

FIG. 17(B) is a schematic external view of an SD card, and FIG. 17(C) is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

Figure 17D:
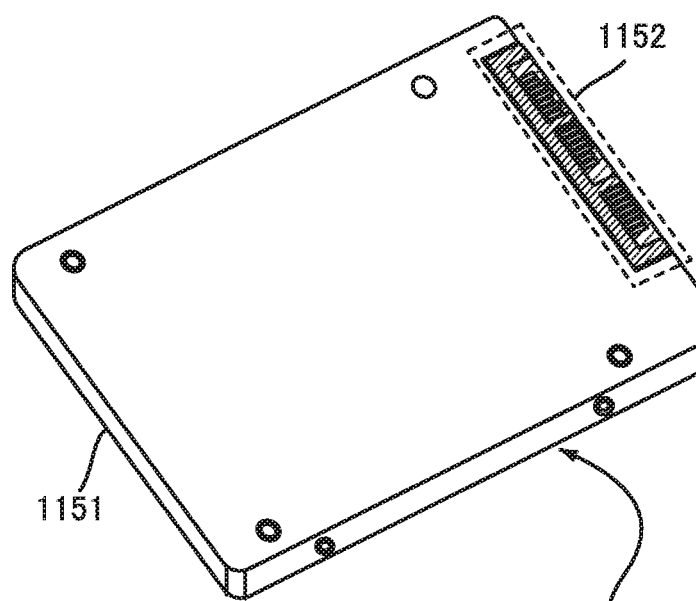
Figure 17E:
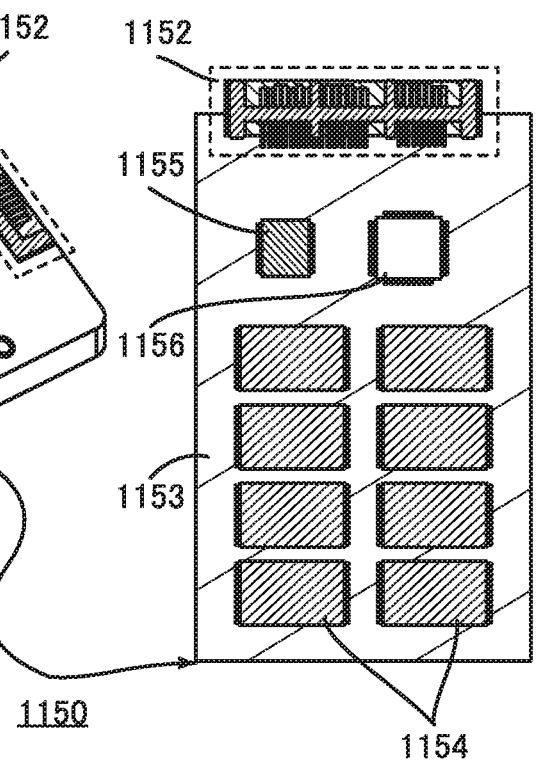

FIG. 17(D) is a schematic external view of an SSD, and FIG. 17(E) is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with the structures described in the other embodiments and the like.

Embodiment 6

<Electronic Device>

A semiconductor device of one embodiment of the present invention can be used for a variety of electronic devices. FIG. 18 illustrates specific examples of the electronic devices using the semiconductor device of one embodiment of the present invention.

Figure 18A:
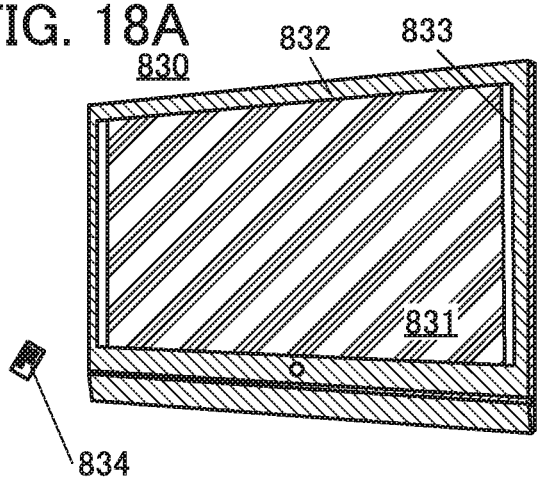
FIG. 18 Diagrams each illustrating an electronic device of one embodiment of the present invention.

FIG. 18(A) illustrates a monitor 830. The monitor 830 includes a display portion 831, a housing 832, a speaker 833, and the like. Furthermore, an LED lamp, operation keys (including a power switch or an operation switch), a connection terminal, a variety of sensors, a microphone, and the like can be included. The monitor 830 can be controlled with a remote controller 834.

The monitor 830 can function as a television device by receiving airwaves.

Examples of the airwaves the monitor 830 can receive include ground waves and waves transmitted from a satellite. The example of the airwaves also include analog broadcasting, digital broadcasting, image-sound-only broadcasting, and sound-only broadcasting. For example, airwaves transmitted in a certain frequency band in a UHF band (higher than or equal to 300 MHz and lower than or equal to 3 GHz) or a VHF band (higher than or equal to 30 MHz and lower than or equal to 300 MHz) can be received. When a plurality of pieces of data received in a plurality of frequency bands is used, the transfer rate can be increased and more information can be obtained. Accordingly, the display portion 831 can display an image with a resolution exceeding the full high definition. An image with a resolution of, for example, 4K2K, 8K4K, 16K8K, or more can be displayed.

A structure may be employed in which an image to be displayed on the display portion 831 is generated using broadcasting data transmitted with a technology for transmitting data via a computer network such as the Internet, a LAN (Local Area Network), or Wi-Fi (registered trademark). In this case, the monitor 830 does not need to include a tuner.

The monitor 830 can be used as a computer monitor when connected to a computer. Several people can see the monitor 830 connected to a computer at the same time; thus, the monitor 830 can be used for a conference system. The monitor 830 can also be used for a videoconference system by display of data in a computer via a network or connection of the monitor 830 itself to a network.

The monitor 830 can also be used as a digital signage.

The semiconductor device of one embodiment of the present invention can be used for, for example, a driver circuit or an image processing portion of the display portion. When the semiconductor device of one embodiment of the present invention is used for the driver circuit or the image processing portion of the display portion, high-speed operation or signal processing can be achieved with low power consumption.

When an AI system using the semiconductor device of one embodiment of the present invention is used for the image processing portion of the monitor 830, image processing such as noise removal processing, grayscale conversion processing, color tone correction processing, or luminance correction processing can be performed. Furthermore, pixel interpolation processing due to resolution up-conversion, frame interpolation processing due to frame frequency up-conversion, or the like can be performed. In the grayscale conversion processing, not only the number of grayscale levels of an image can be changed, but also interpolation of the gray value in the case of increasing the number of grayscale levels can be performed. In addition, high-dynamic range (HDR) processing for increasing a dynamic range is also included in the grayscale conversion processing.

Figure 18B:
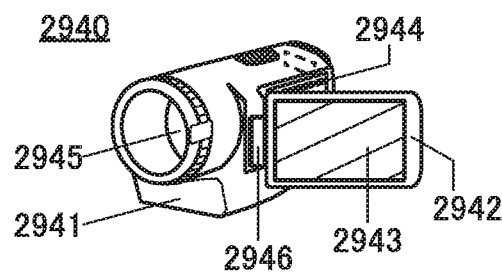

A video camera 2940 illustrated in FIG. 18(B) includes a housing 2941, a housing 2942, a display portion 2943, operation switches 2944, a lens 2945, a joint 2946, and the like. The operation switches 2944 and the lens 2945 are provided on the housing 2941, and the display portion 2943 is provided on the housing 2942. The video camera 2940 also includes an antenna, a battery, and the like inside the housing 2941. A structure is employed in which the housing 2941 and the housing 2942 are connected to each other with the joint 2946, and the angle between the housing 2941 and the housing 2942 can be changed with the joint 2946. The orientation of an image displayed on the display portion 2943 may be changed and display and non-display of an image can be switched depending on the angle between the housing 2941 and the housing 2942.

The semiconductor device of one embodiment of the present invention can be used for, for example, a driver circuit or an image processing portion of the display portion. When the semiconductor device of one embodiment of the present invention is used for the driver circuit or the image processing portion of the display portion, high-speed operation or signal processing can be achieved with low power consumption.

When an AI system using the semiconductor device of one embodiment of the present invention is used for the image processing portion of the monitor 830, imaging appropriate for the surroundings of the video camera 2940 can be achieved. Specifically, imaging can be performed with optimal exposure for the surrounding brightness. In the case of performing imaging with backlighting or imaging under different brightness conditions such as indoors and outdoors at the same time, high-dynamic-range (HDR) imaging can be performed.

Furthermore, the AI system can learn the user's habit and assist in performing imaging. Specifically, the AI system can learn the user's camera shaking habit and correct the camera shaking during imaging, so that blurring of the obtained image associated with camera shaking can be reduced as much as possible. In the case of using a zoom function during imaging, the orientation of the lens or the like can be controlled such that a subject is positioned at the center of an image all the time.

Figure 18C:
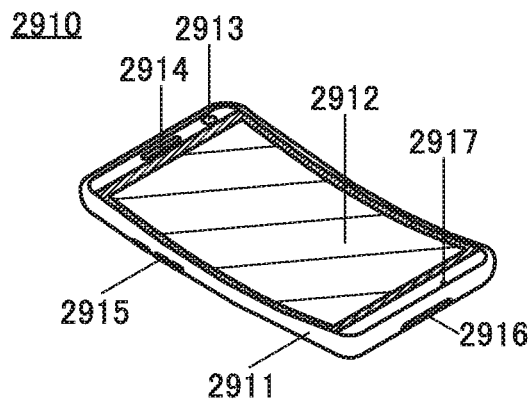

An information terminal 2910 illustrated in FIG. 18(C) includes a housing 2911, a display portion 2912, a microphone 2917, a speaker portion 2914, a camera 2913, an external connection portion 2916, operation switches 2915, and the like. A display panel and a touch screen that use a flexible substrate are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

For example, a memory device using the semiconductor device of one embodiment of the present invention can retain control data, a control program, or the like of the information terminal 2910 for a long time.

When an AI system using the semiconductor device of one embodiment of the present invention is used for an image processing portion of the information terminal 2910, image processing such as noise removal processing, grayscale conversion processing, color tone correction processing, or luminance correction processing can be performed. Furthermore, pixel interpolation processing due to resolution up-conversion, frame interpolation processing due to frame frequency up-conversion, or the like can be performed. In the grayscale conversion processing, not only the number of grayscale levels of an image can be changed, but also interpolation of the gray value in the case of increasing the number of grayscale levels can be performed. In addition, high-dynamic range (HDR) processing for increasing a dynamic range is also included in the grayscale conversion processing.

Furthermore, the AI system can learn the user's habit and assist in operating the information terminal 2910. The information terminal 2910 into which the AI system is incorporated can predict touch input from the motion of the user's fingers, eyes, or the like.

Figure 18D:
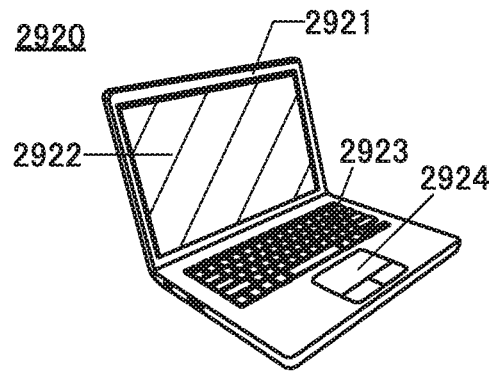

A laptop personal computer 2920 illustrated in FIG. 18(D) includes a housing 2921, a display portion 2922, a keyboard 2923, a pointing device 2924, and the like. The laptop personal computer 2920 also includes an antenna, a battery, and the like inside the housing 2921.

For example, a memory device using the semiconductor device of one embodiment of the present invention can retain control data, a control program, or the like of the laptop personal computer 2920 for a long time.

When an AI system using the semiconductor device of one embodiment of the present invention is used for an image processing portion of the laptop personal computer 2920, image processing such as noise removal processing, grayscale conversion processing, color tone correction processing, or luminance correction processing can be performed. Furthermore, pixel interpolation processing due to resolution up-conversion, frame interpolation processing due to frame frequency up-conversion, or the like can be performed. In the grayscale conversion processing, not only the number of grayscale levels of an image can be changed, but also interpolation of the gray value in the case of increasing the number of grayscale levels can be performed. In addition, high-dynamic range (HDR) processing for increasing a dynamic range is also included in the grayscale conversion processing.

Furthermore, the AI system can learn the user's habit and assist in operating the laptop personal computer 2920. The laptop personal computer 2920 into which the AI system is incorporated can predict touch input to the display portion 2922, from the motion of the user's fingers, eyes, or the like. In inputting text, the AI system predicts input from the past input text data or a text or a diagram such as a photograph around the text, to assist conversion. Accordingly, input mistakes and conversion mistakes can be reduced as much as possible.

Figure 18E:
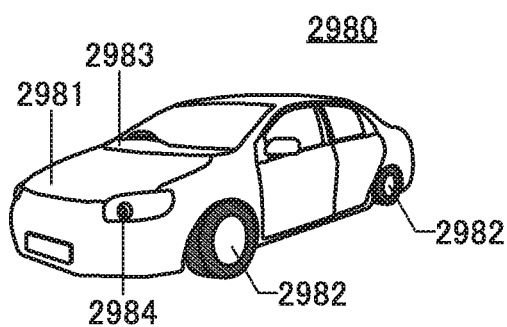
Figure 18F:
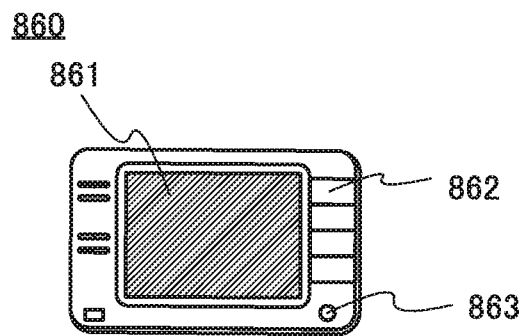

FIG. 18(E) is an external view illustrating an example of an automobile, and FIG. 18(F) illustrates a navigation device 860. An automobile 2980 includes a car body 2981, wheels 2982, a dashboard 2983, lights 2984, and the like. The automobile 2980 also includes an antenna, a battery, and the like. The navigation device 860 includes a display portion 861, operation buttons 862, and an external input terminal 863. The automobile 2980 and the navigation device 860 can be independent of each other; however, it is preferable that a structure be employed in which the navigation device 860 is incorporated into and linked to the automobile 2980.

For example, a memory device using the semiconductor device of one embodiment of the present invention can retain control data, a control program, or the like of the automobile 2980 or the navigation device 860 for a long time. When an AI system using the semiconductor device of one embodiment of the present invention is used for a control device or the like of the automobile 2980, the AI system can learn driver's driving skill and habit and assist in safe driving or driving involving efficient use of fuel such as gasoline or a battery. To assist in safe driving, the AI system learns not only driver's driving skill and habit, but also learns the behavior of the automobile such as the speed and movement of the automobile 2980, road information saved in the navigation device 860, and the like complexly; thus, driving lane departure can be prevented and collision with other automobiles, pedestrians, objects, and the like can be avoided. Specifically, when there is a sharp curve in the traveling direction, the navigation device 860 transmits the road information to the automobile 2980 so that the speed of the automobile 2980 can be controlled and steering can be assisted.

This embodiment can be implemented in an appropriate combination with the structures described in the other embodiments and the like.

REFERENCE NUMERALS

100: capacitor, 110: conductor, 112: conductor, 120: conductor, 130: insulator, 150: insulator, 200: transistor, 203: conductor, 205: conductor, 205*a*: conductor, 205*b*: conductor, 210: insulator, 212: insulator, 214: insulator, 216: insulator, 218: conductor, 220: insulator, 222: insulator, 224: insulator, 224A: insulating film, 230: oxide, 230*a*: oxide, 230A: oxide film, 230*b*: oxide, 230B: oxide film, 230*c*: oxide, 230C: oxide film, 231: region, 231*a*: region, 231*b*:

region, 234: region, 239: region, 240: conductor, 240a: conductor, 240b: conductor, 242: conductor, 242a: conductor, 242A: conductive film, 242b: conductor, 243: region, 243a: region, 243b: region, 246: conductor, 250: insulator, 250A: insulating film, 260: conductor, 260a: conductor, 260Aa: conductive film, 260Ab: conductive film, 260b: conductor, 262: dummy gate, 262A: dummy gate layer, 273: insulator, 273A: insulating film, 274: insulator, 274A: insulating film, 276: insulator, 280: insulator, 282: insulator, 283: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: transistor, 405: conductor, 405a: conductor, 405b: conductor, 430c: oxide, 431a: oxide, 431b: oxide, 432a: oxide, 432b: oxide, 440: conductor, 440a: conductor, 440b: conductor, 442: conductor, 442a: conductor, 442b: conductor, 450: insulator, 460: conductor, 460a: conductor, 460b: conductor.

The invention claimed is:

1. A semiconductor device comprising:
a first insulator;
a second insulator over the first insulator;
an oxide over the second insulator;
a first conductor and a second conductor over the oxide;
a third insulator over the oxide;
a third conductor positioned over the third insulator and overlapping with the oxide;
a fourth insulator in contact with the second insulator, a side surface of the oxide, a side surface of the first conductor, a top surface of the first conductor, a side surface of the second conductor, a top surface of the second conductor, and a side surface of the third insulator; and
a fifth insulator in contact with a top surface of the third insulator and a top surface of the third conductor,
wherein a top surface of the fourth insulator is in contact with the fifth insulator, and
wherein each of the first insulator, the fourth insulator, and the fifth insulator is an oxide containing one or both of aluminum and hafnium.

2. The semiconductor device according to claim 1, wherein the first insulator, the fourth insulator, and the fifth insulator are less likely to transmit oxygen than the second insulator and the third insulator.

3. The semiconductor device according to claim 1, wherein the first insulator, the fourth insulator, and the fifth insulator are less likely to transmit hydrogen than the second insulator and the third insulator.

4. A semiconductor device comprising:
a first insulator;
a second insulator over the first insulator;
an oxide over the second insulator;
a first conductor and a second conductor over the oxide;
a third insulator over the oxide;
a third conductor positioned over the third insulator and overlapping with the oxide;
a fourth insulator in contact with the second insulator, a side surface of the oxide, a side surface of the first conductor, a top surface of the first conductor, a side surface of the second conductor, a top surface of the second conductor, and a side surface of the third insulator; and
a fifth insulator in contact with a top surface of the third insulator and a top surface of the third conductor,
wherein a top surface of the fourth insulator is in contact with the fifth insulator,
wherein the second insulator has an opening exposing the first insulator, and
wherein the fourth insulator is in contact with the first insulator through the opening, and
wherein each of the first insulator, the fourth insulator, and the fifth insulator is an oxide containing one or both of aluminum and hafnium.

5. A method for manufacturing a semiconductor device, comprising:
forming a first insulator over a substrate;
depositing an oxide film and a first conductive film in this order over the first insulator;
processing the oxide film and the first conductive film to form an oxide and a conductor layer;
depositing a dummy gate film to cover the oxide and the conductor layer;
processing the dummy gate film to form a dummy gate layer;
depositing a first insulating film to cover the first insulator, the oxide, and the conductor layer;
depositing a second insulating film over the first insulating film;
partly removing the dummy gate layer, the first insulating film, and the second insulating film by first chemical mechanical polishing (CMP) treatment until part of the dummy gate layer is exposed;
etching part of the conductor layer and the dummy gate layer to form a first conductor and a second conductor and expose the oxide;
depositing a third insulating film and a second conductive film in this order;
removing the third insulating film and the second conductive film by second chemical mechanical polishing (CMP) treatment until part of the second insulating film is exposed to form a third insulator and a third conductor; and
depositing a fourth insulating film to cover the second insulating film, the third insulator, and the third conductor.

* * * * *